US012568824B2

(12) United States Patent
Wang et al.

(10) Patent No.: US 12,568,824 B2
(45) Date of Patent: Mar. 3, 2026

(54) PACKAGE ASSEMBLY INCLUDING LIQUID ALLOY THERMAL INTERFACE MATERIAL (TIM) AND SEAL RING AROUND THE LIQUID ALLOY TIM AND METHODS OF FORMING THE SAME

(71) Applicant: Taiwan Semiconductor Manufacturing Company Limited, Hsinchu (TW)

(72) Inventors: Chin-Hua Wang, New Taipei City (TW); Yu-Sheng Lin, Zhubei City (TW); Po-Yao Lin, Zhudong Township (TW); Ming-Chih Yew, Hsinchu City (TW); Shin-Puu Jeng, Po-Shin Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/783,980

(22) Filed: Jul. 25, 2024

(65) Prior Publication Data

US 2024/0379496 A1     Nov. 14, 2024

Related U.S. Application Data

(62) Division of application No. 17/486,964, filed on Sep. 28, 2021, now Pat. No. 12,255,119.

(60) Provisional application No. 63/212,135, filed on Jun. 18, 2021.

(51) Int. Cl.
| | |
|---|---|
| *H01L 23/42* | (2006.01) |
| *H01L 21/52* | (2006.01) |
| *H01L 23/053* | (2006.01) |
| *H01L 23/10* | (2006.01) |
| *H01L 25/065* | (2023.01) |

(52) U.S. Cl.
CPC .............. *H01L 23/42* (2013.01); *H01L 21/52* (2013.01); *H01L 23/053* (2013.01); *H01L 23/10* (2013.01); *H01L 25/0655* (2013.01)

(58) Field of Classification Search
CPC ...... H01L 23/42; H01L 21/52; H01L 23/3675
USPC .......................................................... 257/668
See application file for complete search history.

(56) References Cited

U.S. PATENT DOCUMENTS

| | | | |
|---|---|---|---|
| 5,909,056 A | 6/1999 | Mertol | |
| 2001/0026957 A1* | 10/2001 | Atwood | H01L 23/4275 |
| | | | 257/E23.109 |
| 2005/0068739 A1* | 3/2005 | Arvelo | H01L 23/3675 |
| | | | 257/E23.09 |
| 2008/0137300 A1* | 6/2008 | Macris | H01L 23/433 |
| | | | 257/E23.09 |
| 2010/0096747 A1 | 4/2010 | Kusano | |
| 2012/0098118 A1 | 4/2012 | Lin et al. | |

(Continued)

OTHER PUBLICATIONS

TW Patent and Trademark Office; TW Application No. 111113448; Office Action mailed Jul. 10, 2025; 27 pages.

*Primary Examiner* — Quoc D Hoang
(74) *Attorney, Agent, or Firm* — The Marbury Law Group, PLLC

(57) ABSTRACT

A package assembly includes an interposer module on a package substrate, a liquid alloy thermal interface material (TIM) on the interposer module, a seal ring surrounding the liquid alloy TIM, and a package lid on the liquid alloy TIM and seal ring, wherein the seal ring, interposer module and package lid seal the liquid alloy TIM.

20 Claims, 18 Drawing Sheets

(56) References Cited

U.S. PATENT DOCUMENTS

2017/0092619 A1* 3/2017 Refai-Ahmed ......... H01L 23/04
2020/0227336 A1    7/2020 Eid

* cited by examiner

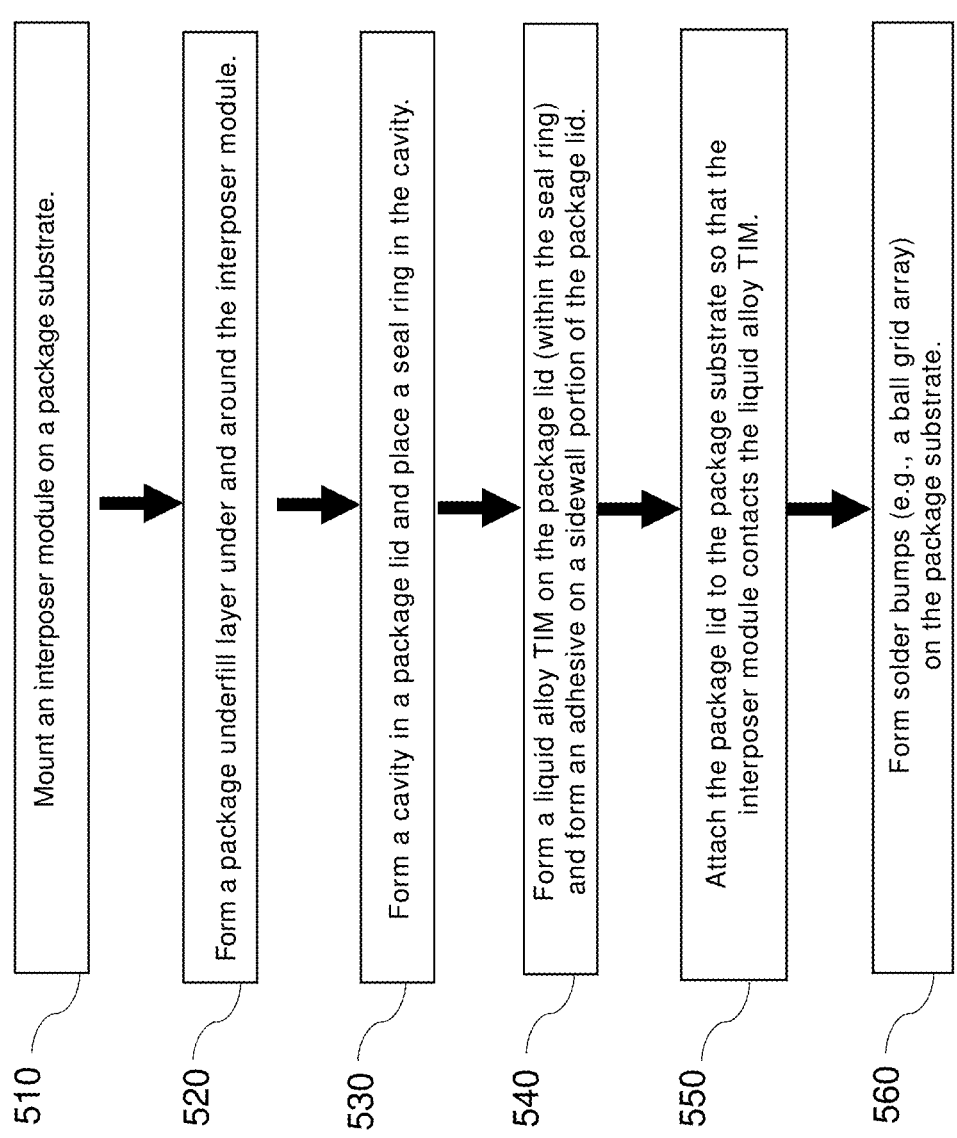

FIG. 5

510 — Mount an interposer module on a package substrate.

520 — Form a package underfill layer under and around the interposer module.

530 — Form a cavity in a package lid and place a seal ring in the cavity.

540 — Form a liquid alloy TIM on the package lid (within the seal ring) and form an adhesive on a sidewall portion of the package lid.

550 — Attach the package lid to the package substrate so that the interposer module contacts the liquid alloy TIM.

560 — Form solder bumps (e.g., a ball grid array) on the package substrate.

PACKAGE ASSEMBLY INCLUDING LIQUID ALLOY THERMAL INTERFACE MATERIAL (TIM) AND SEAL RING AROUND THE LIQUID ALLOY TIM AND METHODS OF FORMING THE SAME

RELATED APPLICATIONS

This application is a divisional application of U.S. patent application Ser. No. 17/486,964 entitled "Package Assembly Including Liquid Alloy Thermal Interface Material (TIM) and Seal Ring Around the Liquid Alloy TIM and Methods of Forming the Same," filed on Sep. 28, 2021, which claims the benefit of priority from U.S. Provisional Application No. 63/212,135, entitled "Novel TIM Scheme on interposor package for thermal performance enhancement" filed on Jun. 18, 2021, the entire contents of both of which are incorporated herein by reference for all purposes.

BACKGROUND

A package assembly may include one or semiconductor dies that may be stacked or mounted on an interposer. Operation of the semiconductor dies may generate a large amount of heat to be dissipated. Designing for heat dissipation in the package assembly may be challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 is a flow chart illustrating a method of making a package assembly according to one or more embodiments.

DETAILED DESCRIPTION

Figure 1A:
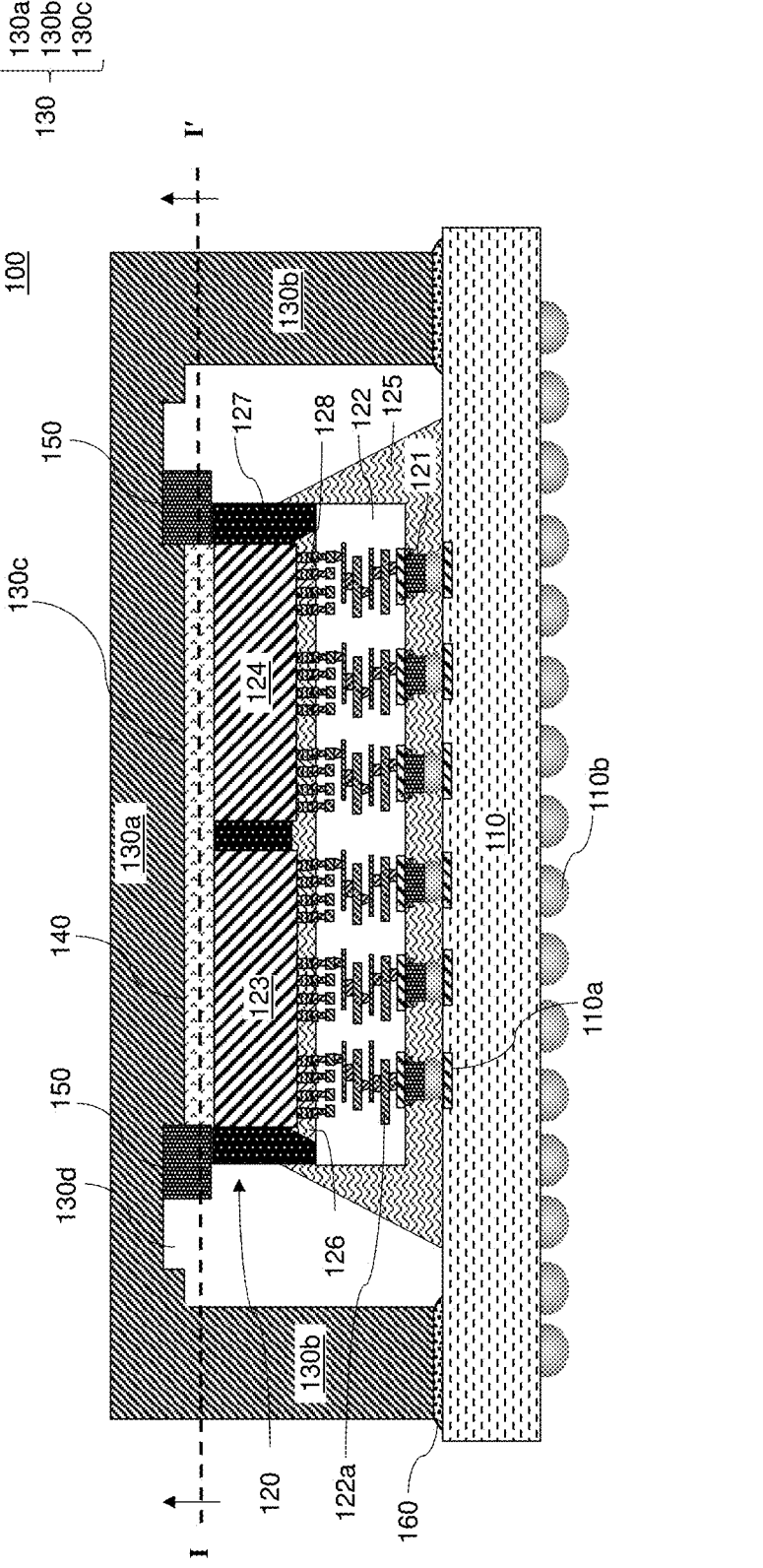
FIG. 1A illustrates a vertical cross-sectional view of the package assembly along the line II-II' in FIG. 1B according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

In a typical package assembly, the heat generated in the semiconductor dies may be dissipated to another component within the package assembly. Beyond the semiconductor dies and other components in the package assembly, the package assembly may also include materials such as underfill, molding compound, and the like. However, these other materials may be ineffective in conducting or dissipating heat that is generated by the semiconductor dies. As a result, the heat may be trapped around the semiconductor dies and may cause a sharp local temperature peak (e.g., a hot spot). The local temperature peak may diminish the performance and reliability of the package assembly.

A typical lid-type interposer package assembly may include an interposer module on a package substrate, and a thermal interface material (TIM) on the interposer module. The TIM may be either a gel TIM (e.g., silicon-based gel TIM), film TIM (e.g., graphite-based film TIM) or solder TIM (e.g., metal-based solder TIM; solidified material). A package lid may be located over the interposer module and secured to the package substrate.

An overall thermal performance of the TIM may include bulk thermal resistance TR ($TR=BLT \times K^{-1} \times A^{-1}$, where BLT is bond-line-thickness of the TIM, K is thermal conductivity of the TIM, and A is the area of the surface of the interposer module that contacts the TIM) and contact thermal resistance (e.g., contact resistance between the package lid and TIM, and contact resistance between the interposer module and TIM). Bulk thermal impedance ($TI=BLT \times K^{-1}$) of TIM is an index to evaluate TIM thermal performance and may be relative to bond-line-thickness (BLT) and thermal conductivity (K).

For example, a gel TIM may have a bulk thermal impedance of 10° C.-mm²/W (BLT-80 μm and K=8 W/mK), a film TIM may have a bulk thermal impedance of 6.5° C.-mm²/W (BLT=150 μm and K=23 W/mK), and a solder TIM may have a bulk thermal impedance of 5° C.-mm²/W (BLT=350 μm and K=70 W/mK). Thus, a bulk thermal resistance of these typical TIMs may be limited to 5° C.-mm²/W which may be insufficient for a high power high performance computing (HPC) device that may have, for example, an overall power density greater than 1 W/mm².

The various embodiments disclosed herein may include a liquid alloy TIM (e.g., an alloy that is liquid phase during a package operating temperature (e.g., about 100° C. to 200° C.)) and an added seal ring (e.g., seal ring enclosure) that may at least partially surround the liquid alloy TIM to help prevent pump-out of the liquid alloy TIM. That is, the various embodiments disclosed herein may provide a novel thermal interface material (TIM) scheme on an interposer package assembly (e.g., organic/silicon interposer package) for thermal performance enhancement. The various embodiments of the present invention may be especially helpful for enhancing the thermal performance of an organic/silicon interposer package assembly with a high power HPC function (e.g., an overall power density greater than 1 W/mm²).

The various embodiments of the present invention may include a package assembly (e.g., organic/silicon interposer package) that may include an interposer module mounted by C4 bumps on a package substrate. The interposer module may include an interposer and one or more semiconductor chips or devices (e.g., system of chips (SOC), memory chip, etc.) mounted on the interposer by micro-bumps. A first underfill material may be formed around the microbumps under the one or more semiconductor chips, and a second underfill material may be formed around the C4 bumps under the interposer.

A molding material layer may be formed on the one or more semiconductor chips, and a liquid alloy TIM may be formed on the molding material layer. The liquid alloy TIM may include a material that is liquid phase at room temperature, such as InGa, InGaSn, GaInSn, GaInSnZn or a combination thereof. The thermal conductivity of the liquid alloy TIM may be relatively high (e.g., greater than about 30 W/m-K) and the bond-line-thickness (BLT) may be easy to control (e.g., less than about 100 μm). Thus, the liquid alloy TIM may have a bulk thermal impedance of less than about 3.4° C.-mm²/W, and may provide excellent surface wetting and lower contact resistance.

A package lid may be formed over the interposer module and the TIM, and mounted on the package substrate by an adhesive. Solder balls (e.g., ball grid array (BGA)) may be formed on the underside of the package substrate to allow for mounting the package assembly, for example, onto a printed circuit board (PCB).

A seal ring may enclose (e.g., surround) the liquid alloy TIM to help prevent pump-out of the liquid alloy TIM. The seal ring may include, for example, rubber, graphite film TIM, a thermal pad, adhesive or a combination thereof. The seal ring may be positioned in a cavity formed in a main body of the package lid. A shape of the cavity may be designed for seal ring placement. For example, with reference to FIG. 3, a width (CW) of the cavity may be greater than or equal to a width (SW) of the seal ring, and a height (CH) of the cavity may be less than or equal to a height (SH) of the seal ring. A bond-line-thickness of the TIM (BLT) may be less than or equal to the difference between the height (SH) of the seal ring and the height (CH) of the cavity (e.g., SH–CH).

Figure 1B:
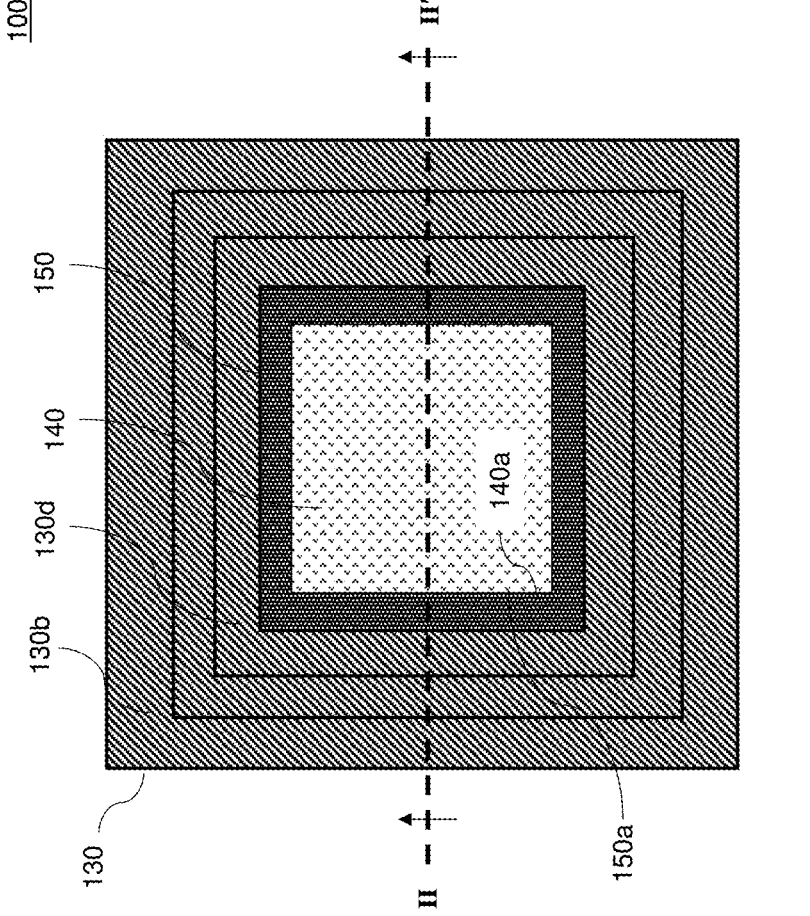
FIG. 1B illustrates a horizontal cross-sectional view of the package assembly along the line I-I' in FIG. 1A according to one or more embodiments.

FIGS. 1A-1B illustrate a package assembly 100 (e.g., organic/silicon interposer package) according to one or more embodiments. FIG. 1A illustrates a vertical cross-sectional view of the package assembly 100 along the line II-II' in FIG. 1B according to one or more embodiments. FIG. 1B illustrates a horizontal cross-sectional view of the package assembly 100 along the line I-I' in FIG. 1A according to one or more embodiments.

The package assembly 100 may include a package substrate 110, an interposer module 120 mounted on the package substrate 110, and a package lid 130 on the interposer module 120 and attached to the package substrate 110. The package assembly 100 may also include a liquid alloy TIM 140 formed on the interposer module 120, and a seal ring 150 surrounding the liquid alloy TIM 140 and sealing the liquid alloy TIM 140. That is, the seal ring 150 may surround the liquid alloy TIM 140 and may together with the interposer module 120 and the package lid 130 seal the liquid alloy TIM 140.

The package substrate 110 may include, for example, a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. The package substrate 110 may also include metal interconnects and through vias to provide an electrical connection of the package substrate 110.

The package substrate 110 may also include metal bonding pads 110a formed on the one side of the package substrate 110 (e.g., a chip-side of the package substrate), for providing an electrical connection to a device (e.g., interposer module, semiconductor die, etc.) that is mounted on the package substrate 110. A ball-grid array (BGA) including a plurality of solder balls 110b may be formed on an opposite side of the package substrate 110 (e.g., board-side of the package substrate 110). The solder balls 110b may allow the package assembly 100 to be securely mounted on a substrate such as a printed circuit board (PCB) and electrically coupled to the substrate. The solder balls 110b may be electrically connected to the metal bonding pads 110a by the metal interconnects and through vias in the package substrate 110.

The interposer module 120 may be mounted by C4 bumps 121 on the metal bonding pads 110a in the package substrate 110. The interposer module 120 may include an interposer dielectric layer 122 that may include metal interconnects 122a connected to the C4 bumps 121. The interposer module 120 may also include a first semiconductor die 123 (e.g., main interposer module die) mounted on the interposer dielectric layer 122, and a second semiconductor die 124 (e.g., semiconductor chip) mounted on the interposer dielectric layer 122. The first semiconductor die 123 and second semiconductor die 124 may be mounted on the interposer dielectric layer 122 by micro-bumps 128 that may be electrically connected to the metal interconnects 122*a*. A package underfill layer 125 may be formed under and around the interposer module 120 and the C4 bumps 121 so as to fix the interposer module 120 to the package substrate 110. The package underfill layer 125 may be formed of an epoxy-based polymeric material.

The first semiconductor die 123 may include, for example, a system assembly such as a system on chip (SOC) assembly or a system on integrated chip (SoIC) assembly. The second semiconductor die 124 may include, for example, a high-bandwidth memory (HBM) chip. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS) technology or integrated fan-out on substrate (INFO-oS) technology.

An interposer underfill layer 126 may be formed around the micro-bumps 128 and between the first semiconductor die 123 and the interposer dielectric layer 122, and between the second semiconductor die 124 and the interposer dielectric layer 122. The interposer underfill layer 126 may also be formed between first semiconductor die 123 and the second semiconductor die 124. The interposer underfill layer 126 may also be formed of an epoxy-based polymeric material. A molding material layer 127 may be formed over the first semiconductor die 123, the second semiconductor die 124, the interposer underfill layer 126 and the interposer dielectric layer 122. The molding material layer 127 may be formed of an epoxy molding compound (EMC).

The liquid alloy TIM 140 may be formed on the interposer module 120 to help allow for the dissipation of heat generated during operation of the package assembly 100 (e.g., operation of first semiconductor die 123 and second semiconductor die 124). In particular, the liquid alloy TIM 140 may contact an upper surface of first semiconductor die 123, an upper surface of second semiconductor die 124 and the molding material layer 127. The liquid alloy TIM 140 may include a material that is liquid phase at room temperature, such as InGa or InGaSn or GaInSn or GaInSnZn. The thermal conductivity of the liquid alloy TIM 140 may be relatively high (e.g., greater than about 30 W/m-K) and the bond-line-thickness (BLT) (e.g., the distance between the package lid 130 and the interposer module 120) may be less than about 100 μm, although greater or lesser distances may be used. Thus, the liquid alloy TIM 140 may have a bulk thermal impedance of less than about 3.4° C.-mm²/W.

The package lid 130 may be on the liquid alloy TIM 140 and may provide a cover for the interposer module 120. The package lid 130 be formed, for example, of metal, ceramic or polymer material. The package lid 130 may include a main body 130*a*, a sidewall portion 130*b* that may connect the main body 130*a* to the package substrate 110 by an adhesive 160 (e.g., epoxy adhesive or silicone adhesive, other adhesives are within the contemplated scope of disclosure), and a protrusion portion 130*c* that may project from the main body 130*a* and contact the liquid alloy TIM 140. The main body 130*a* of the package lid 130 may include a cavity 130*d* (e.g., a seal ring placement cavity) and the protrusion portion 130*c* may project from a bottom surface of the cavity 130*d* (i.e., when the lid 130 is inverted). The cavity 130*d* may be formed in a bottom surface of the main body 130*a* of the package lid 130 (e.g., a surface that faces in a direction of the package substrate 110), for example, by milling using a computer numerical control (CNC) milling machine, or by molding the main body 130*a* of the package lid 130 to include the cavity 130*d*.

The package assembly 100 may also include a seal ring 150 formed to contain the liquid alloy TIM 140 and sealing the liquid alloy TIM 140. The seal ring 150 may be formed, for example, of rubber, a graphite film or an adhesive (e.g., epoxy adhesive or silicone adhesive). The seal ring 150 may be located, for example, in the cavity 130*d* and around the protrusion portion 130*c* and around the liquid alloy TIM 140. The seal ring 150 may surround (e.g., at least laterally surround) the TIM 140 and together with the interposer module 120 and the package lid 130, may seal the TIM 140 (e.g., liquid alloy TIM).

Thus, the liquid alloy TIM 140 may be contained by a space that is bounded above (when the lid 130 is inverted) by the protrusion portion 130*c*, on a side by the seal ring 150, and below by the interposer module 120. A volume of the liquid alloy TIM 140 in the package assembly 100 may be substantially equal to a volume of that space. That is, the liquid alloy TIM 140 may substantially fill the space.

As illustrated in FIG. 1B, the package lid 130 may have a square shape or rectangle shape in the horizontal cross-sectional view. Other suitable shapes of the package lid 130 may be within the contemplated scope of disclosure. The sidewall portion 130*b* may be formed around the entire perimeter of the main body 130*a* of the package lid 130. The cavity 130*d* may be formed in the main body 130*a* around an entire perimeter of the liquid alloy TIM 140. The liquid alloy TIM 140 may also have a shape that corresponds to the shape of the cavity 130*d* (i.e., a square shape as shown in FIG. 1B). The liquid alloy TIM 140 may have a shape in the horizontal cross-sectional view that corresponds to (e.g., is substantially the same as) the shape of the cavity 130*d* and may or may not correspond to a shape of the package lid 130.

Further, the seal ring 150 may be located around an entire perimeter of (e.g., surround) the liquid alloy TIM 140. In particular, the inner surface 150*a* of the seal ring 150 may be seated in the cavity 130*d* and contact the outermost portion 140*a* of the liquid alloy TIM 140 around the entire perimeter of the liquid alloy TIM 140. Therefore, the seal ring 150 may contain the liquid alloy TIM 140 around an entire perimeter of the liquid alloy TIM 140.

Figure 2:
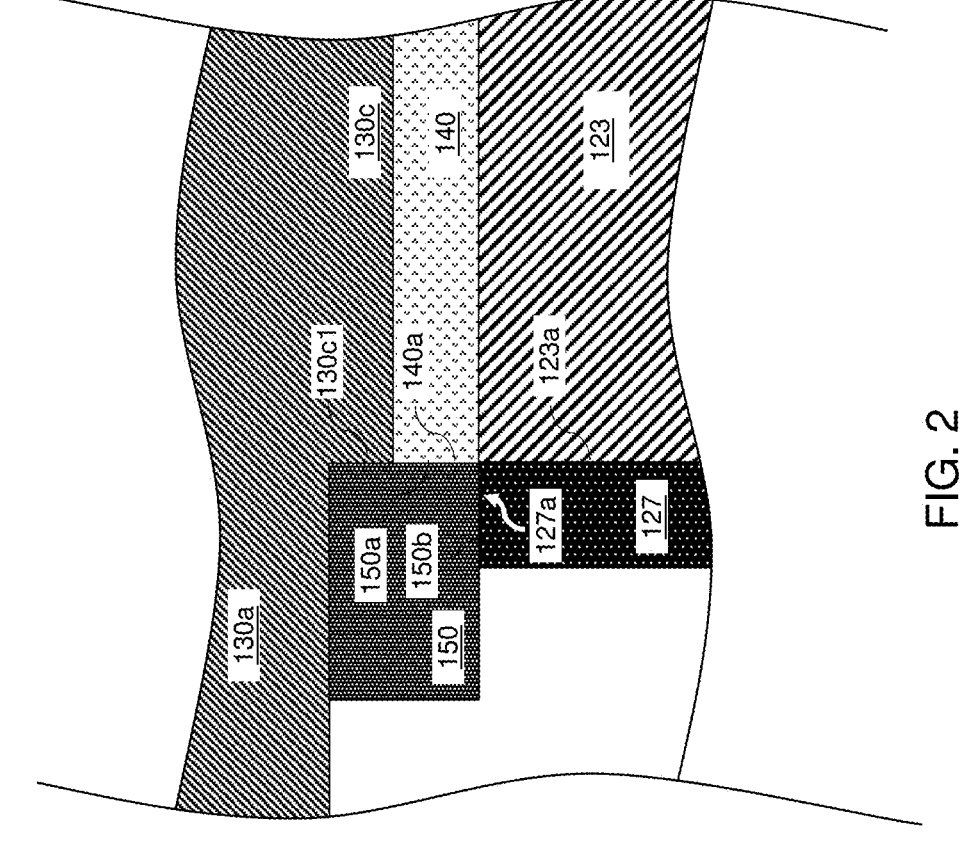
FIG. 2 provides a detailed view of the seal ring and liquid alloy Thermal Interface Material (TIM) according to one or more embodiments.

FIG. 2 provides a detailed vertical cross-sectional view of the seal ring 150 and liquid alloy TIM 140 according to one or more embodiments. As illustrated in FIG. 2, the seal ring 150 may have a rectangular or square cross-section, although other suitable shapes of the seal ring 150 may be within the contemplated scope of disclosure. The inner surface 150*a* of the seal ring 150 may contact an outer surface 130*cl* of the protrusion portion 130*c* and the outermost portion 140*a* of the liquid alloy TIM 140. Further, the outer surface 130*cl* of the protrusion portion 130*c* may be substantially aligned (e.g., substantially vertically aligned) or coincident with the outermost portion 140*a* of the liquid alloy TIM 140 and substantially aligned (e.g., substantially vertically aligned) with the outer wall 123*a* of the first semiconductor die 123.

Further, the seal ring 150 may include a bottom surface 150*b* that adjoins the inner surface 150*a* of the seal ring 150 and contacts an upper surface of the interposer module 120 so that a seal of the liquid alloy TIM 140 may be formed between the bottom surface 150*b* of the seal ring 150 and the upper surface of the interposer module 120. In particular, the bottom surface 150*b* of the seal ring 150 may contact an upper surface 127*a* of molding material layer 127 so that a seal of the liquid alloy TIM 140 may be formed between the bottom surface 150b of the seal ring 150 and the upper surface 127a of the molding material layer 127. The seal ring 150 may also be compressed between the main body 130a of the package lid 130 and the upper surface of the interposer module 120 (e.g., the upper surface 127a of the molding material layer 127) so as to form the seal of the liquid alloy TIM 140 and thereby inhibit pump-out of the liquid alloy TIM 140.

Although it is not illustrated in FIG. 2, the inner surface 150a of the seal ring 150 may contact the outer surface 130c1 of the protrusion portion 130c around an entire perimeter of the protrusion portion 130c. Further, the bottom surface 150b of the seal ring 150 may contact the upper surface 127a of the molding material layer 127 around an entire perimeter of the liquid alloy TIM 140. The seal ring 150 may also be compressed between the main body 130a of the package lid 130 and the upper surface of the interposer module 120 (e.g., the upper surface 127a of the molding material layer 127) around the entire perimeter of the liquid alloy TIM 140. Therefore, the seal of the liquid alloy TIM 140 may be formed between the bottom surface 150b of the seal ring 150 and the upper surface of the interposer module 120 (e.g., the upper surface 127a of the molding material layer 127) around the entire perimeter of the liquid alloy TIM 140.

Figure 3:
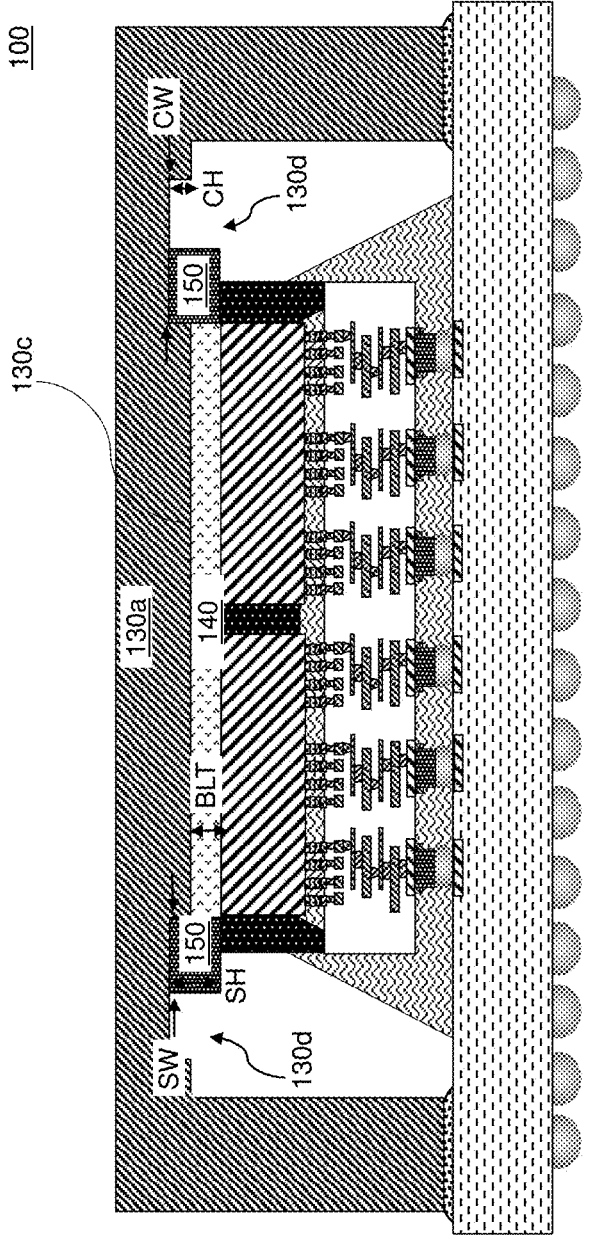
FIG. 3 provides a detailed vertical cross-sectional view of the liquid alloy TIM, the seal ring and the cavity in a main body of the package lid of the package assembly according to one or more embodiments.

FIG. 3 provides a detailed illustration of the liquid alloy TIM 140, the seal ring 150 and the cavity 130d in the package lid 130 of the package assembly 100 according to one or more embodiments. As illustrated in FIG. 3, a cavity width CW of the cavity 130d may be greater than or equal to a seal ring width SW of the seal ring 150, and a cavity height CH of the cavity 130d may be less than or equal to a seal ring height SH of the seal ring 150. Further, a bond-line-thickness BLT of the liquid alloy TIM 140 may be less than or equal to the difference between the seal ring height SH and the cavity height CH.

Figure 4A:
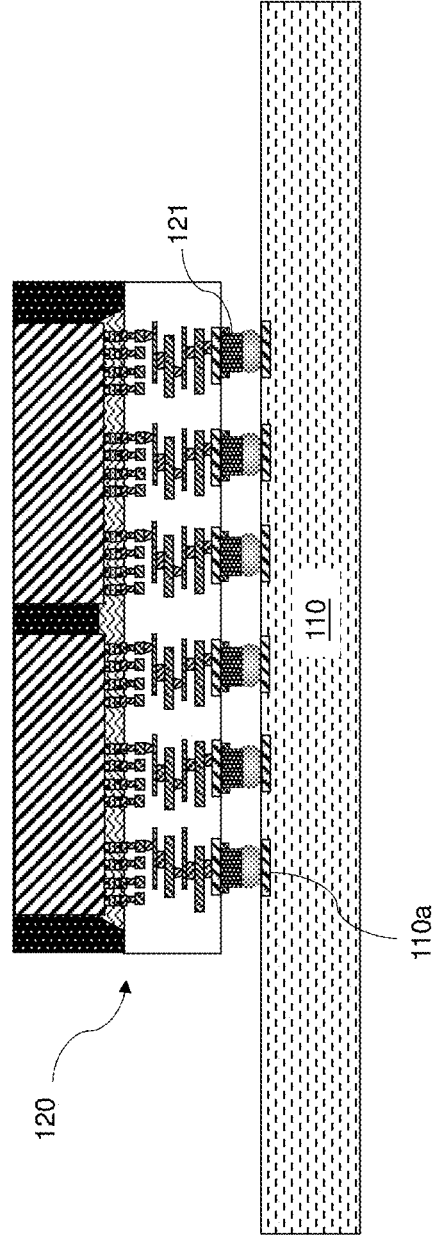
FIGS. 4A-4G illustrate various intermediate structures that may be formed in a method of making a package assembly according to one or more embodiments.

FIGS. 4A-4G illustrate various intermediate structures that may be formed during a method of making a package assembly according to one or more embodiments. FIG. 4A illustrates a vertical cross-sectional view of an intermediate structure in which the interposer module 120 may be mounted on the package substrate 110 according to one or more embodiments. As illustrated in FIG. 4A, the C4 bumps 121 of the interposer module 120 may be positioned on the metal bonding pads 110a of the package substrate 110 and heated in order to bond the C4 bumps 121 to the metal bonding pads 110a.

Figure 4B:
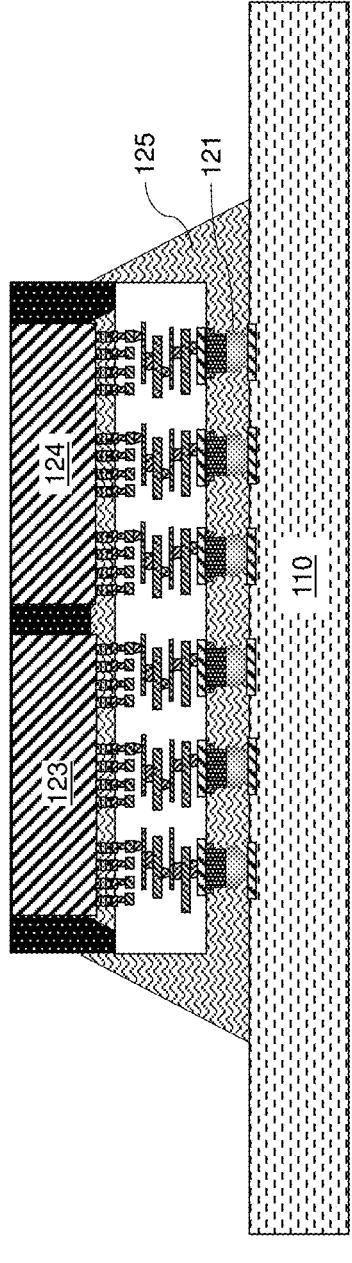

FIG. 4B illustrates a vertical cross-sectional view of an intermediate structure in which the package underfill layer 125 may be formed on the package substrate 110 according to one or more embodiments. As illustrated in FIG. 4B, the package underfill layer 125 may be formed under and around the interposer module 120 and the C4 bumps 121 so as to fix the interposer module 120 to the package substrate 110. The package underfill layer 125 may be formed of an epoxy-based polymeric material.

Figure 4C:
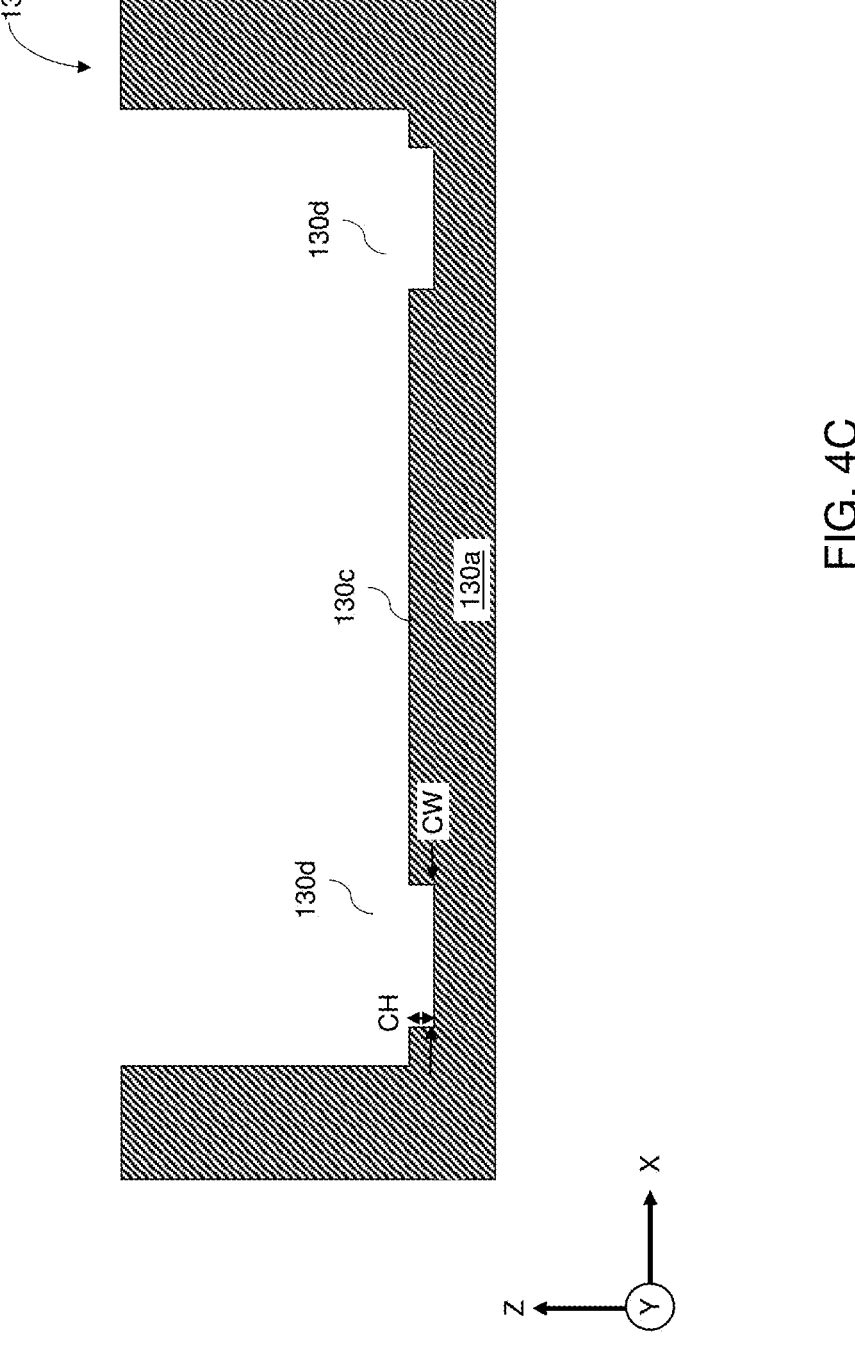

FIG. 4C illustrates a vertical cross-sectional view of an intermediate structure in which the cavity 130d (e.g., a seal ring placement cavity) may be formed in the main body 130a of the package lid 130 according to one or more embodiments. As illustrated in FIG. 4C, the cavity 130d may be formed in the underside of the main body 130a of the package lid 130. The cavity 130d may be formed, for example, by milling using a computer numerical control (CNC) milling machine, or by molding the package lid 130 to include the cavity 130d. The forming of the cavity 130d may also result in the forming of the protrusion portion 130c of the package lid 130. That is, the protrusion portion 130c may project from a bottom surface of the cavity 130d and may have a length in a projecting direction which is substantially equal to the cavity height CH.

The cavity 130d may be formed so as to accommodate placement of the seal ring 150 and may have a shape in a vertical cross-sectional view that may be correspond at least in part by a shape of the seal ring 150. In particular, the cavity height CH and cavity width CW of the cavity 130d may correspond, for example, to a seal ring height SH and seal ring width of the seal ring 150. For example, the cavity width CW may be greater than or equal to the seal ring width SW, and the cavity height CH may be less than or equal to the seal ring height SH.

The outer shape of the cavity 130d in a horizontal cross-sectional view (e.g., see FIG. 1B) may ultimately correspond at least in part by the outer shape (e.g., in a horizontal cross-sectional view) of the interposer module 120. Thus, for example, in embodiments in which a shape of the interposer module 120 may be square, then a shape of the cavity 130d may be square. Similarly, in embodiments in which a shape of the interposer module 120 may be rectangle, then a shape of the cavity 130d may be rectangle, and so on.

Figure 4D:
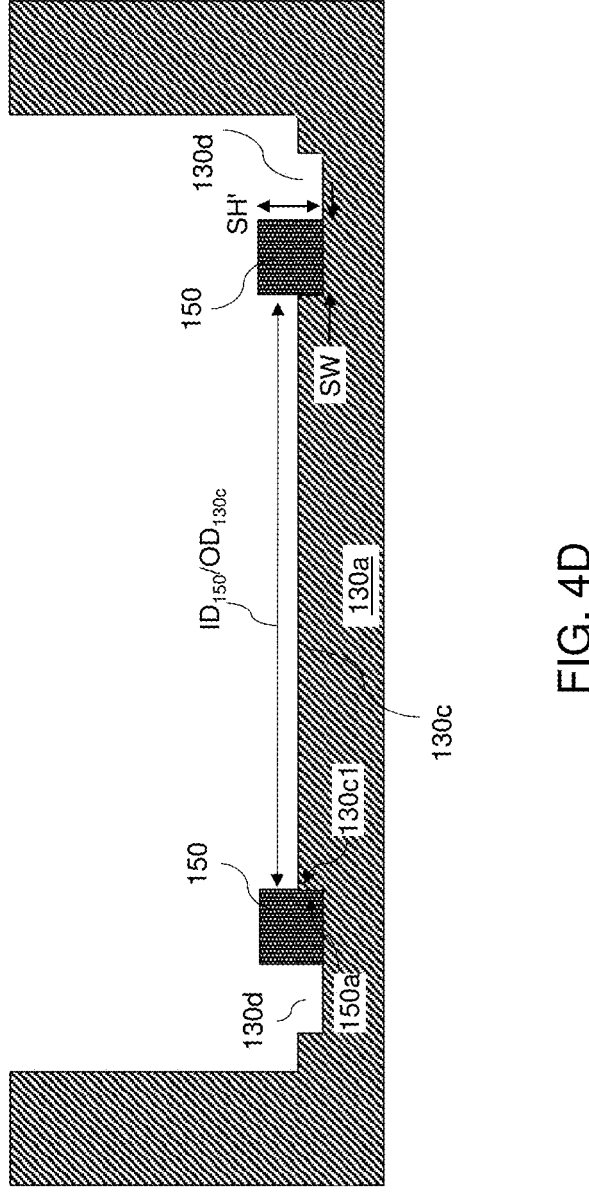

FIG. 4D illustrates a vertical cross-sectional view of an intermediate structure in which the seal ring 150 may be placed in the cavity 130d according to one or more embodiments. The seal ring 150 may be formed, for example, of rubber, a graphite film or an adhesive (e.g., epoxy adhesive or silicone adhesive). The seal ring 150 may be placed in the cavity 130d so as to surround the protrusion portion 130c and so as to contact the main body 130a of the package lid 130 around the entire perimeter of the protrusion portion 130c. The inner surface 150a of the seal ring 150 may contact the outer surface 130c1 of the protrusion portion 130c around an entire perimeter of the protrusion portion 130c.

The seal ring 150 may be formed so as to have an inner diameter $ID_{150}$ that may be substantially equal to an outer diameter $OD_{130c}$ of the protrusion portion 130c. In that case, the seal ring 150 may be seated in position in the cavity 130d without being under any tension. Alternatively, the seal ring 150 may be formed to have an inner diameter $ID_{150}$ that may be slightly less than an outer diameter $OD_{130c}$ of the protrusion portion 130c. In that case, the seal ring 150 may be deformed (e.g., stretched) slightly to be seated in position in the cavity 130d and may be snug-fit around the protrusion portion 130c. The protrusion portion 130c may help to fix the lateral position of the seal ring 150.

The seal ring width SW may be less than or equal to the cavity width CW and the resting state seal ring height SH' may be greater than or equal to the cavity height CH. The resting state seal ring height SH' and seal ring width SW may correspond, for example, to a desired thickness (e.g., bond-line-thickness) of the liquid alloy TIM 140. The thickness of the TIM 140 may be configured so as to meet the heat dissipation parameters of the interposer module 120. Thus, the seal ring height SH' and seal ring width SW may correspond to the heat dissipation parameters of the interposer module 120.

Figure 4E:
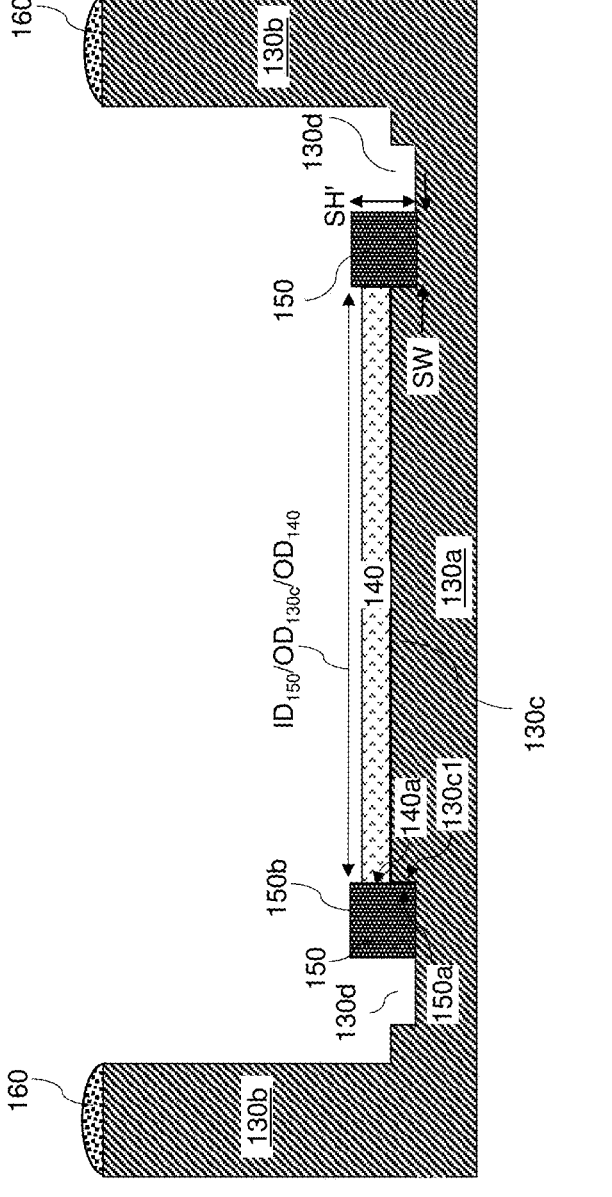

FIG. 4E illustrates a vertical cross-sectional view of an intermediate structure in which the liquid alloy TIM 140 may be placed on the package lid 130 according to one or more embodiments. As noted above, the liquid alloy TIM 140 may include a material that is liquid phase at room temperature, such as InGa or InGaSn or GaInSn or GaIn-SnZn. The liquid alloy TIM 140 may be placed on the package lid 130 by dispensing the liquid alloy TIM 140 from a container such as by pouring, injecting, etc. A thickness of the liquid alloy TIM 140 may be, for example, less than about 100 μm, although greater or lesser thickness of the liquid alloy TIM 140.

The liquid alloy TIM 140 may be dispensed onto the protrusion portion 130*c* so that a height of the liquid alloy TIM 140 may be less than a height of the bottom surface 150*b* of the seal ring 150. This embodiment configuration may allow the liquid alloy TIM 140 to be contained on the protrusion portion 130*c* by the seal ring 150 as it is being dispensed. The configuration may also allow for the seal ring 150 to be compressed in a later assembly step by a compressive force, so that the height of the liquid alloy TIM 140 in the completed package assembly 100 may be substantially equal to the height of the bottom surface 150*b* of the seal ring 150.

The inner surface 150*a* of the seal ring 150 may contact the outermost portion 140*a* of the liquid alloy TIM 140 around the entire perimeter of the liquid alloy TIM 140. That is, an outer diameter $OD_{140}$ of the liquid alloy TIM 140 may be substantially equal to an inner diameter ID 150 of the seal ring 150 and substantially equal to an outer diameter $OD_{130c}$ of the protrusion portion 130*c*. Therefore, the seal ring 150 may contain the liquid alloy TIM 140 on the protrusion portion 130*c* around an entire perimeter of the liquid alloy TIM 140.

In addition, the adhesive 160 may be applied to a bottom of the sidewall portion 130*b* of the package lid 130. The adhesive 160 may include, for example, a silicone adhesive or an epoxy adhesive.

Figure 4F:
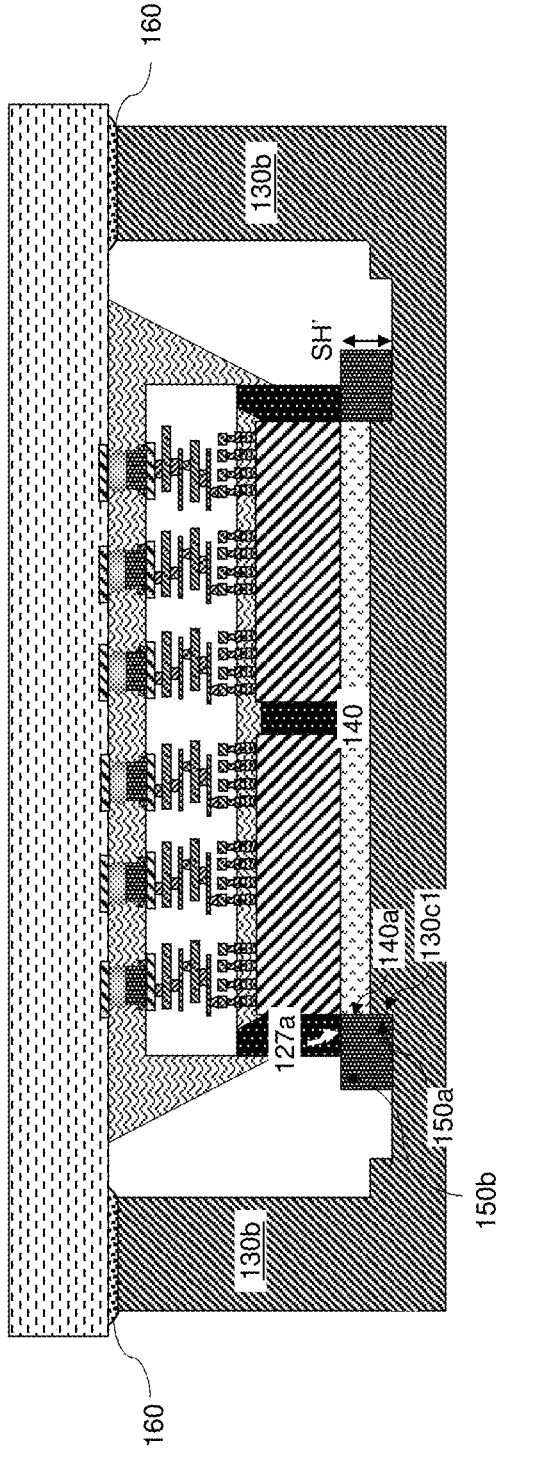

FIG. 4F illustrates a vertical cross-sectional view of an intermediate structure in which the package substrate 110 and interposer module 120 may be attached to the package lid 130 according to one or more embodiments. As illustrated in FIG. 4F, the package substrate 110 with the interposer module 120 attached thereto, may be inverted (e.g., flipped) so that the upper surface of the interposer module 120 faces the liquid alloy TIM 140. The interposer module 120 may then be positioned in the package lid 130 so as to be aligned with the liquid alloy TIM 140.

The package substrate 110 and interposer module 120 may then be pressed by applying a pressing force down into the package lid 130 so that the sidewall portion 130*b* of the package lid 130 may contact the package substrate 110 through the adhesive 160. The pressing force may also cause the seal ring 150 to be compressed (e.g., deformed) between the main body 130*a* of the package lid 130 and the upper surface of the interposer module 120 (e.g., the upper surface 127*a* of the molding material layer 127). The compression of the seal ring 150 may reduce the seal ring height from the resting state seal ring height SH' and cause the seal ring 150 to have a seal ring height SH (e.g., a compressed seal ring height) that is substantially coplanar with the surface of the liquid alloy TIM 140. The pressing force may cause the upper surface of the interposer module 120 to contact the liquid alloy TIM 140. In addition, the pressing force may cause the upper surface of the interposer module 120 (e.g., upper surface 127*a* of the molding material layer 127) to contact the bottom surface 150*b* of the seal ring 150 under force so that a seal of the liquid alloy TIM 140 may be formed between the bottom surface 150*b* of the seal ring 150 and the upper surface 127*a* of the molding material layer 127. The seal ring 150 may be compressed around the entire perimeter of the liquid alloy TIM 140, so that the seal of the liquid alloy TIM 140 may be formed around the entire perimeter of the liquid alloy TIM 140.

At this point, the package substrate 110 may be clamped to the package lid 130 for a period to allow the adhesive 160 to cure and form a secure bond between the package substrate 110 and the package lid 130.

Figure 4G:
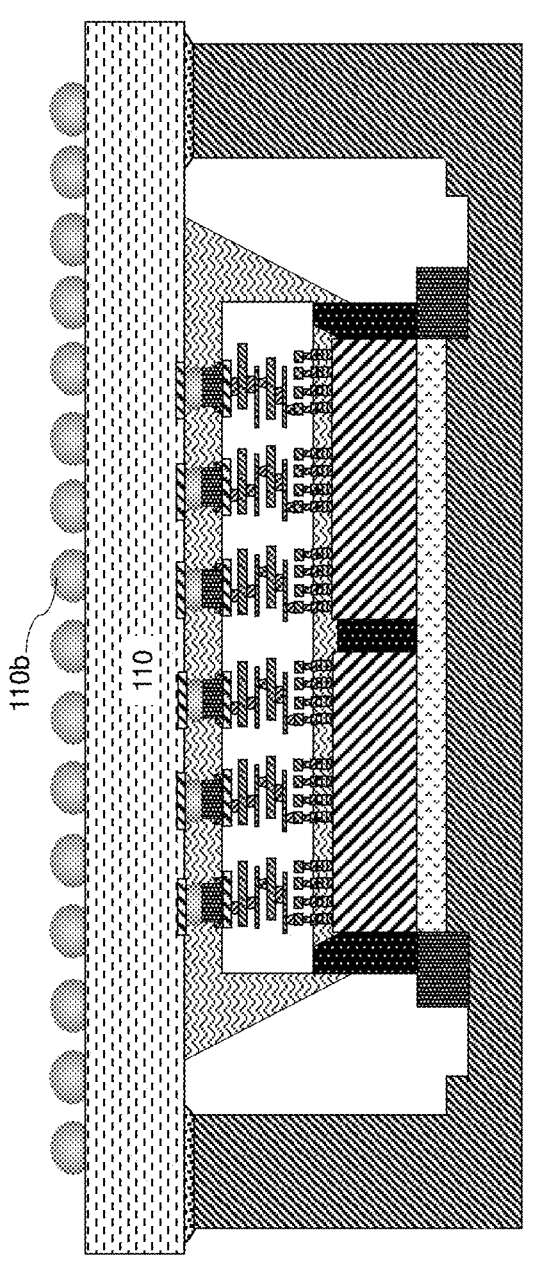

FIG. 4G illustrates a vertical cross-sectional view of an intermediate structure in which a plurality of solder balls 110*b* may be formed on the package substrate 110 according to one or more embodiments. The plurality of solder balls 110*b* may constitute a ball-grid array (BGA) that may allow the package assembly 100 to be securely mounted on a substrate such as a printed circuit board and electrically coupled to the substrate.

FIG. 5 is a flow chart illustrating a method of making a package assembly according to one or more embodiments. Step 510 includes mounting an interposer module on a package substrate. Step 520 includes forming a package underfill layer under and around the interposer module. Step 530 includes forming a cavity in a package lid and placing a seal ring in the cavity. Step 540 includes forming a liquid alloy TIM on the package lid (within the seal ring), and forming an adhesive on a sidewall portion of the package lid. Step 550 includes attaching the package lid to the package substrate so that the interposer module contacts the liquid alloy TIM. Step 560 includes forming solder bumps (e.g., a ball grid array) on the package substrate.

Figure 6:
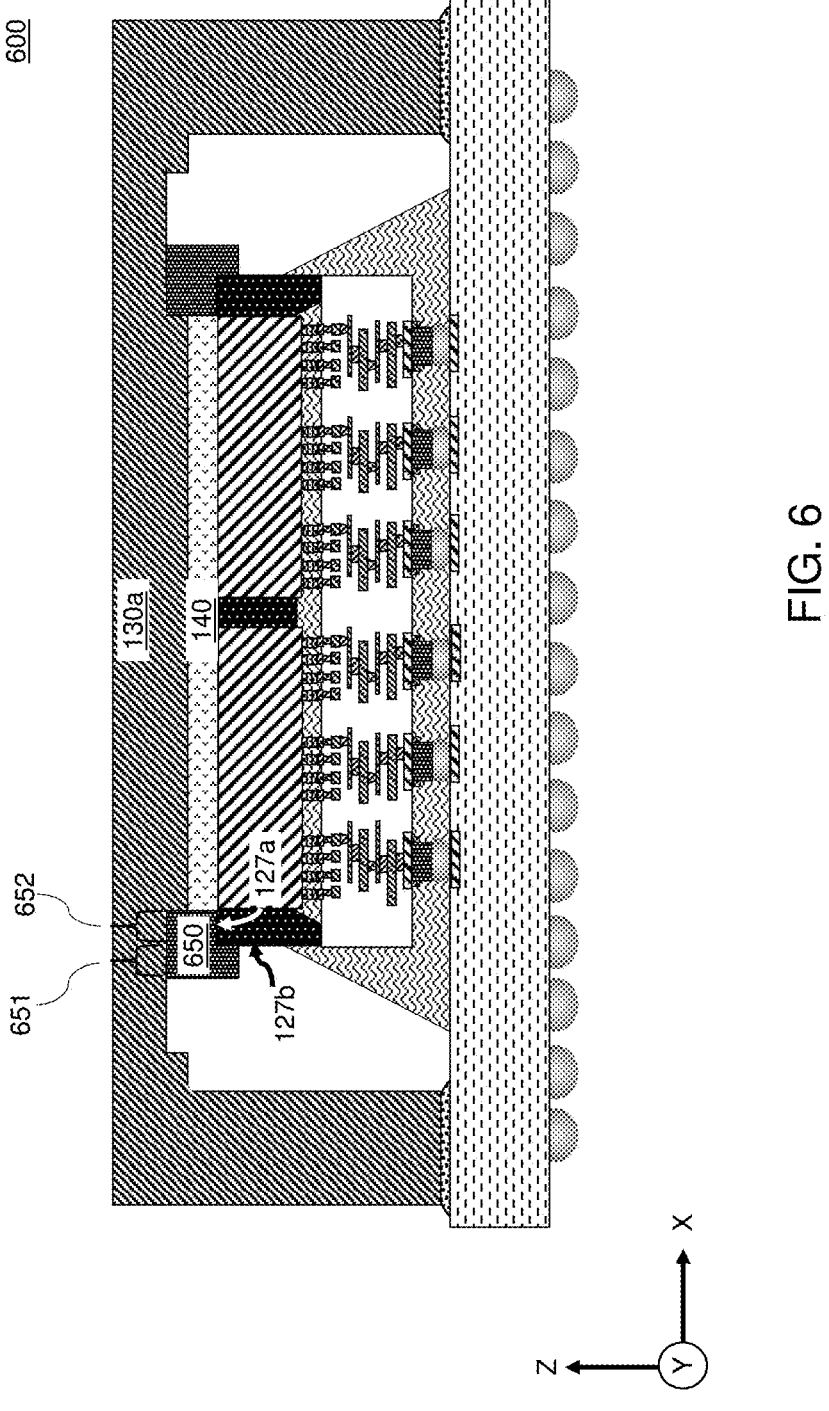
FIG. 6 illustrates a vertical cross-sectional view of a package assembly according to an embodiment.

FIG. 6 illustrates a vertical cross-sectional view of a package assembly 600 according to an alternative embodiment. The package assembly 600 may have a structure and function that is substantially similar to the structure and function described above with respect to package assembly 100. The package assembly 600 may also be manufactured by a method that is substantially similar to the method described above with respect to package assembly 100. Therefore, the package assembly 600 may be described below only to the extent that the structure of the package assembly 600 may differ from the structure of the package assembly 100.

As illustrated in FIG. 6, the package assembly 600 may include a seal ring 650 that includes a seal ring main body 651, and a seal ring projecting portion 652 that may project (e.g., in the x-direction in FIG. 6) from the seal ring main body 651. The seal ring projecting portion 652 may contact the upper surface 127*a* of the molding material layer 127, and may be compressed between main body 130*a* of the package lid and the upper surface 127*a* of the molding material layer 127. The seal ring main body 651 may also contact a side surface 127*b* of the molding material layer 127, so as to form a supplemental seal between the seal ring main body 651 and the side surface 127*b* of the molding material layer 127.

Figure 7:
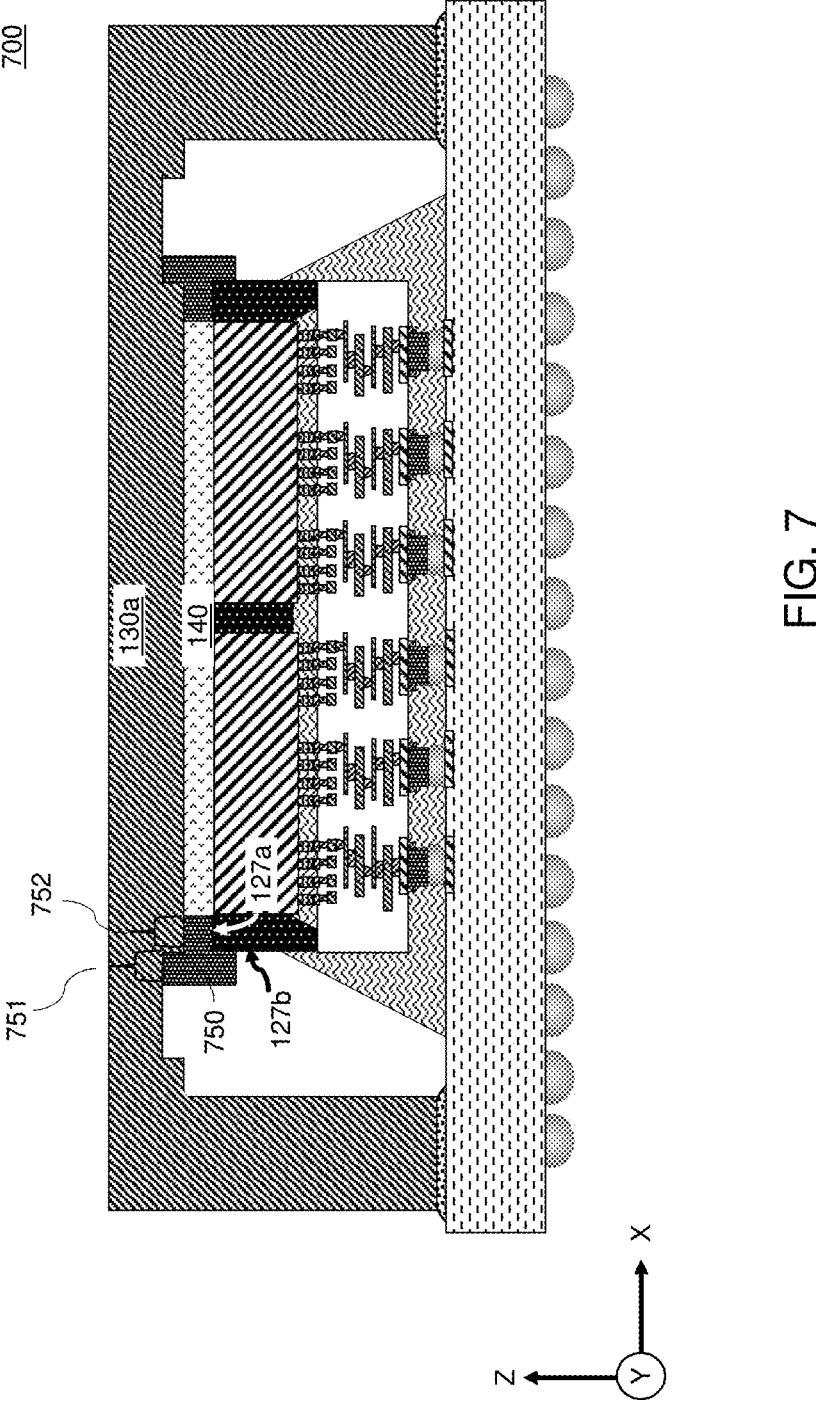
FIG. 7 illustrates a vertical cross-sectional view of a package assembly according to another embodiment.

FIG. 7 illustrates a vertical cross-sectional view of a package assembly 700 according to another alternative embodiment. The package assembly 700 may have a structure and function that is substantially similar to the structure and function described above with respect to package assembly 100. The package assembly 700 may also be manufactured by a method that is substantially similar to the method described above with respect to package assembly 100. Therefore, the package assembly 700 may be described below only to the extent that the structure of the package assembly 700 may differ from the structure of the package assembly 100.

As illustrated in FIG. 7, the package assembly 700 may include a seal ring 750 that may have a T-shaped cross-section. The seal ring 750 may include a seal ring main body 751, and a seal ring projecting portion 752 that may project (e.g., in the x-direction in FIG. 7) from the seal ring main body 751. The seal ring projecting portion 752 may contact the upper surface 127a of the molding material layer 127, and may be compressed between main body 130a of the package lid and the upper surface 127a of the molding material layer 127. The seal ring main body 751 may contact a side surface 127b of the molding material layer 127, so as to form a supplemental seal between the seal ring main body 751 and the side surface 127b of the molding material layer 127.

Figures 8A, 8B:
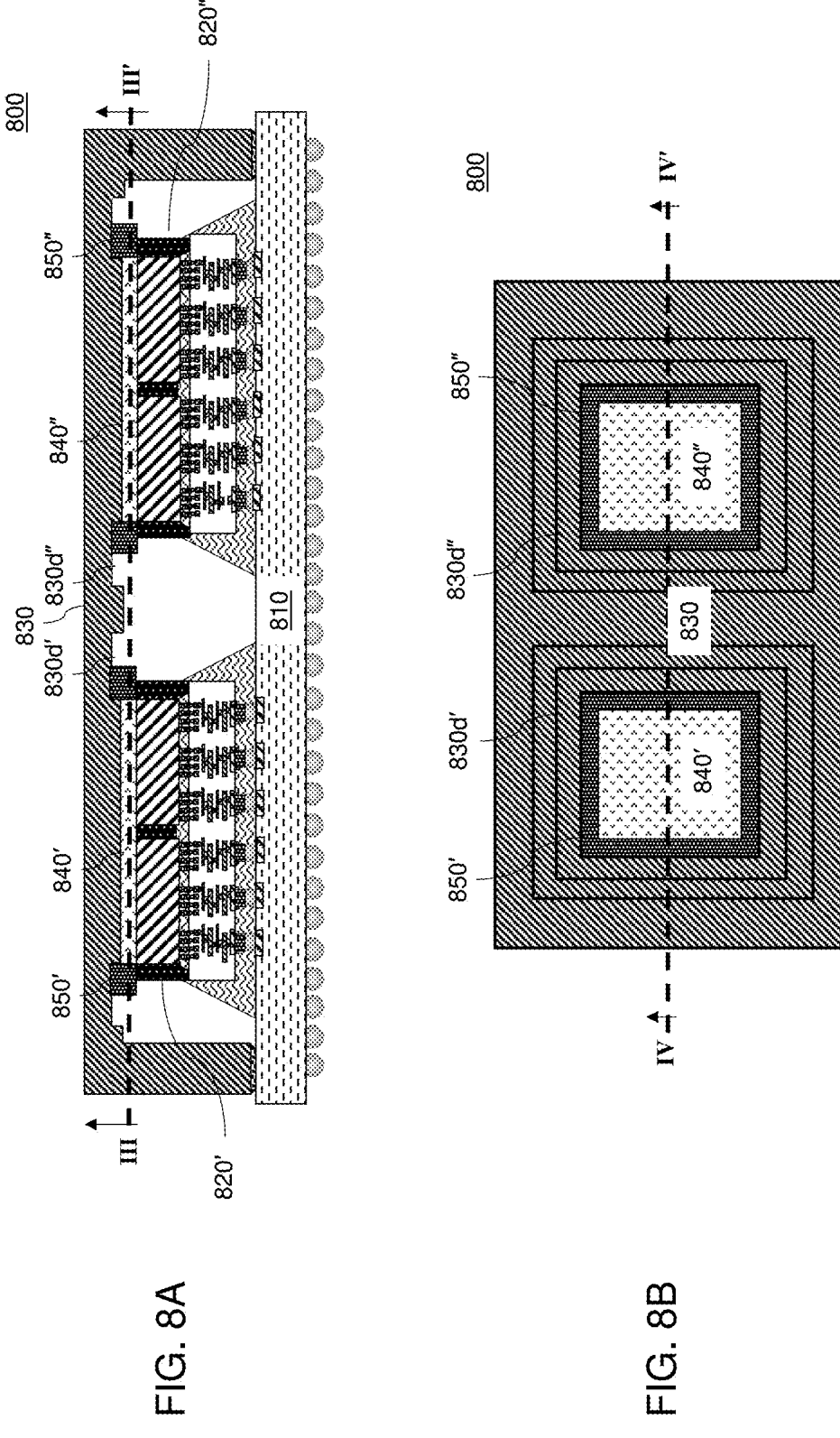
FIG. 8A illustrates a vertical cross-sectional view of the package assembly along the line IV-IV' in FIG. 8B according to one or more embodiments.
FIG. 8B illustrates a horizontal cross-sectional view of the package assembly along the line III-III' in FIG. 8A according to one or more embodiments.

FIGS. 8A and 8B illustrate a package assembly 800 (e.g., organic/silicon interposer package) according to another alternative embodiment. FIG. 8A illustrates a vertical cross-sectional view of the package assembly 800 along the line IV-IV' in FIG. 8B according to one or more embodiments. FIG. 8B illustrates a horizontal cross-sectional view of the package assembly 800 along the line III-III' in FIG. 8A according to one or more embodiments.

The package assembly 800 may have a structure and function that is substantially similar to the structure and function described above with respect to package assembly 100. The package assembly 800 may also be manufactured by a method that is substantially similar to the method described above with respect to package assembly 100. Therefore, the package assembly 800 may be described below only to the extent that the structure of the package assembly 800 may differ from the structure of the package assembly 100.

As illustrated in FIGS. 8A and 8B, the package assembly 800 may include a package lid 830 that may have a square shape or rectangle shape in the horizontal cross-sectional view. Other suitable shapes of the package lid 830 may be within the contemplated scope of disclosure. The package assembly 800 may also include a first interposer module 820' formed on a package substrate 810 and a first liquid alloy TIM 840' formed on the first interposer module 820'. The package assembly 800 may also include a first seal ring 850' formed in a first cavity 830d' of the package lid 830. As illustrated in FIG. 8B, the first seal ring 850' may help to form a seal of the first liquid alloy TIM 840' around an entire perimeter of the first liquid alloy TIM 840'. That is, the seal ring 850' may surround the liquid alloy TIM 840' and may together with the interposer module 820' and package lid 830 seal the liquid alloy TIM 840'. The first liquid alloy TIM 840' may have a square shape. In particular, the liquid alloy TIM 140 may have a shape in the horizontal cross-sectional view that corresponds to (e.g., is substantially the same as) the shape of the first cavity 830d' in the package lid 830.

The package assembly 800 may also include a second interposer module 820" formed on the package substrate 810 and a second liquid alloy TIM 840" formed on the second interposer module 820". The package assembly 800 may also include a second seal ring 850" formed in a second cavity 830d" of the package lid 830. As illustrated in FIG. 8B, the second seal ring 850" may form a seal of the second liquid alloy TIM 840" around an entire perimeter of the second liquid alloy TIM 840". That is, the second seal ring 850" may surround the second liquid alloy TIM 840" and may together with the second interposer module 820" and package lid 830 seal the second liquid alloy TIM 840". The second liquid alloy TIM 840" may also have a square shape. In particular, the second liquid alloy TIM 840" may have a shape in the horizontal cross-sectional view that corresponds to (e.g., is substantially the same as) the shape of the second cavity 830d" in the package lid 830.

Figures 9A, 9B:
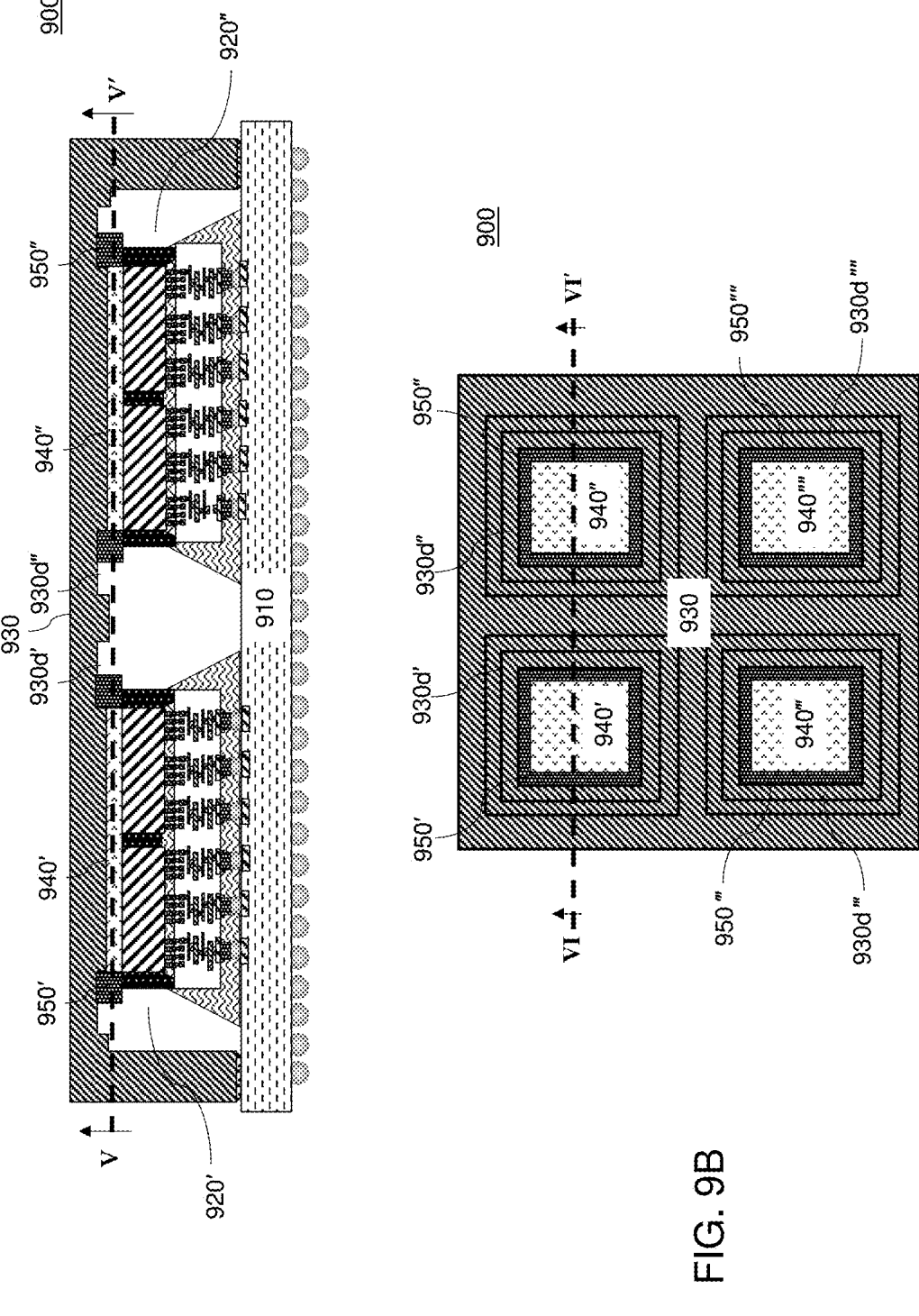
FIG. 9A illustrates a vertical cross-sectional view of the package assembly along the line VI-VI' in FIG. 9B according to one or more embodiments.
FIG. 9B illustrates a horizontal cross-sectional view of the package assembly along the line V-V' in FIG. 9A according to one or more embodiments.

FIGS. 9A and 9B illustrate a package assembly 900 (e.g., organic/silicon interposer package) according to one or more embodiments. FIG. 9A illustrates a vertical cross-sectional view of the package assembly 900 along the line VI-VI' in FIG. 9B according to one or more embodiments. FIG. 9B illustrates a horizontal cross-sectional view of the package assembly 900 along the line V-V' in FIG. 9A according to one or more embodiments.

The package assembly 900 may have a structure and function that is substantially similar to the structure and function described above with respect to package assembly 100. The package assembly 900 may also be manufactured by a method that is substantially similar to the method described above with respect to package assembly 100. Therefore, the package assembly 900 may be described below only to the extent that the structure of the package assembly 900 may differ from the structure of the package assembly 100.

As illustrated in FIGS. 9A and 9B, the package assembly 900 may include a package lid 930 that may have a square shape or rectangle shape in the horizontal cross-sectional view. Other suitable shapes of the package lid 930 may be within the contemplated scope of disclosure. The package assembly 900 may also include a first interposer module 920' formed on a package substrate 910 and a first liquid alloy TIM 940' formed on the first interposer module 920'. The package assembly 900 may also include a first seal ring 950' formed in a first cavity 930d' of the package lid 930. As illustrated in FIG. 9B, the first seal ring 950' may form a seal of the first liquid alloy TIM 940' around an entire perimeter of the first liquid alloy TIM 940'. That is, the first seal ring 950' may surround the first liquid alloy TIM 940' and may together with the first interposer module 920' and package lid 930 seal the first liquid alloy TIM 940'. The first liquid alloy TIM 940' may have a square shape. In particular, the liquid alloy TIM 940' may have a shape in the horizontal cross-sectional view that corresponds to (e.g., is substantially the same as) the shape of the first cavity 930d' in the package lid 930.

The package assembly 900 may also include a second interposer module 920" formed on the package substrate 910 and a second liquid alloy TIM 940" formed on the second interposer module 920". The package assembly 900 may also include a second seal ring 950" formed in a second cavity 930d" of the package lid 930. As illustrated in FIG. 9B, the second seal ring 950" may form a seal of the second liquid alloy TIM 940" around an entire perimeter of the second liquid alloy TIM 940". That is, the second seal ring 950" may surround the second liquid alloy TIM 940" and may together with the second interposer module 920" and package lid 930 seal the second liquid alloy TIM 940". The second liquid alloy TIM 940" may also have a square shape. In particular, the second liquid alloy TIM 940" may have a shape in the horizontal cross-sectional view that corresponds to (e.g., is substantially the same as) the shape of the second cavity 930d" in the package lid 930.

The package assembly 900 may also include a third interposer module (not shown) formed on the package substrate 910 and a third liquid alloy TIM 940'' formed on the third interposer module. The package assembly 900 may also include a third seal ring 950'' formed in a third cavity 930d'' of the package lid 930. As illustrated in FIG. 9B, the third seal ring 950'' may form a seal of the third liquid alloy TIM 940'' around an entire perimeter of the third liquid alloy TIM 940''. That is, the third seal ring 950'' may surround the third liquid alloy TIM 940'' and may together with the third interposer module and package lid 930 seal the third liquid alloy TIM 940''. The third liquid alloy TIM 940'' may also have a square shape. In particular, the third liquid alloy TIM 940'' may have a shape in the horizontal cross-sectional view that corresponds to (e.g., is substantially the same as) the shape of the third cavity 930*d*'' in the package lid 930.

The package assembly 900 may also include a fourth interposer module (not shown) formed on the package substrate 910 and a fourth liquid alloy TIM 940'' formed on the fourth interposer module. The package assembly 900 may also include a fourth seal ring 950'' formed in a fourth cavity 930*d*'' of the package lid 930. As illustrated in FIG. 9B, the fourth seal ring 950'' may form a seal of the fourth liquid alloy TIM 940'' around an entire perimeter of the fourth liquid alloy TIM 940''. That is, the fourth seal ring 950'' may surround the fourth liquid alloy TIM 940'' and may together with the fourth interposer module and package lid 930 seal the fourth liquid alloy TIM 940''. The fourth liquid alloy TIM 940'' may also have a square shape. In particular, the fourth liquid alloy TIM 940'' may have a shape in the horizontal cross-sectional view that corresponds to (e.g., is substantially the same as) the shape of the fourth cavity 930*d*'' in the package lid 930.

Figures 10A, 10B:
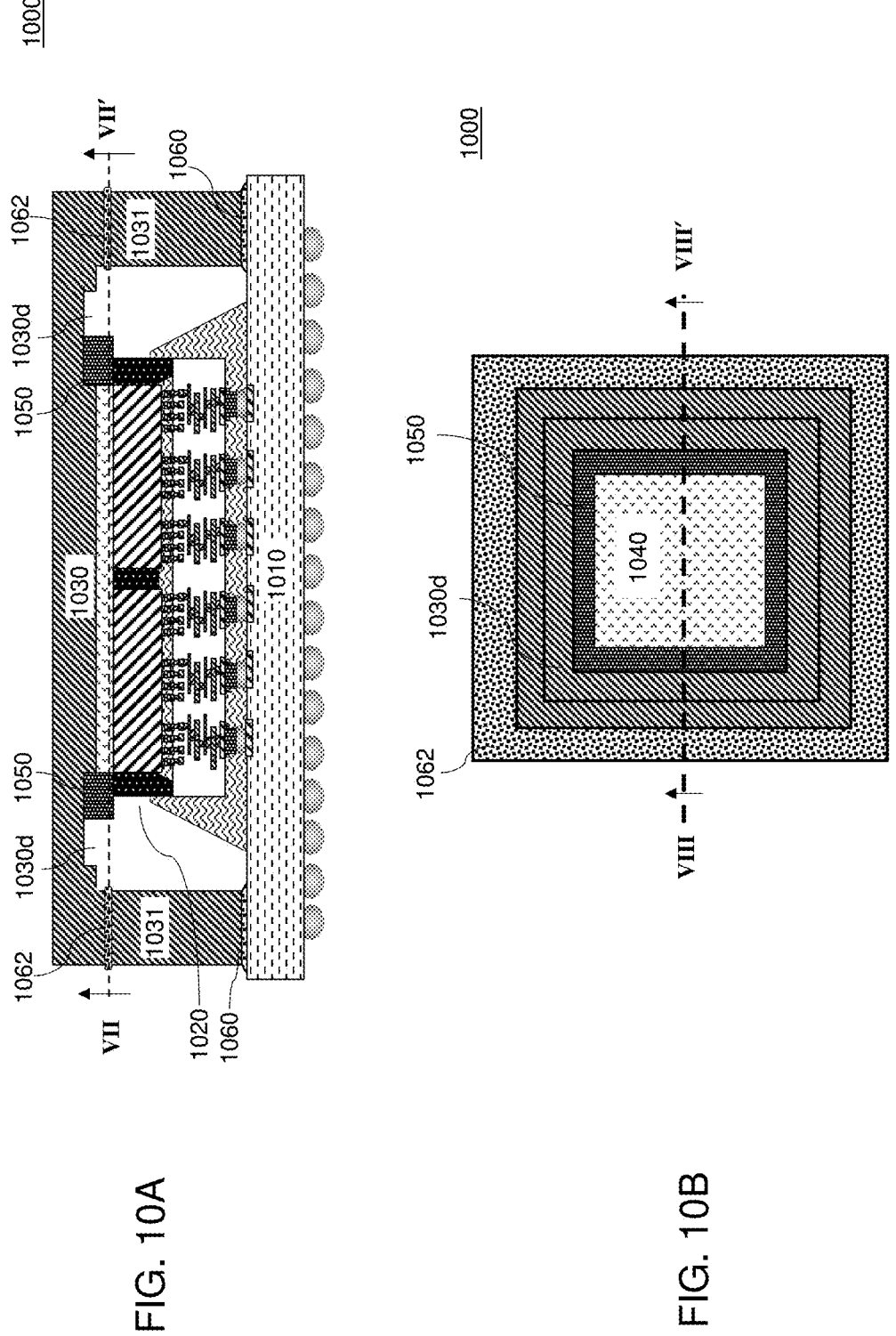
FIG. 10A illustrates a vertical cross-sectional view of the package assembly along the line VIII-VIII' in FIG. 10B according to one or more embodiments.
FIG. 10B illustrates a horizontal cross-sectional view of the package assembly along the line VII-VII' in FIG. 10A according to one or more embodiments.

FIGS. 10A and 10B illustrate a package assembly 1000 (e.g., organic/silicon interposer package) according to one or more embodiments. FIG. 10A illustrates a vertical cross-sectional view of the package assembly 1000 along the line VIII-VIII' in FIG. 10B according to one or more embodiments. FIG. 10B illustrates a horizontal cross-sectional view of the package assembly 1000 along the line VII-VII' in FIG. 10A according to one or more embodiments.

The package assembly 1000 may have a structure and function that is substantially similar to the structure and function described above with respect to package assembly 100. The package assembly 1000 may also be manufactured by a method that is substantially similar to the method described above with respect to package assembly 100. Therefore, the package assembly 1000 may be described below only to the extent that the structure of the package assembly 1000 may differ from the structure of the package assembly 100.

As illustrated in FIGS. 10A-10B, the package assembly 1000 may include a stiffener ring 1031 that is adhered to a package substrate 1010 by a first adhesive 1060. The stiffener ring 1031 may be formed of a metal such as copper with a nickel coating, or an aluminum alloy. The first adhesive 1060 may include, for example, a silicone adhesive or an epoxy adhesive. The package assembly 1000 may also include an interposer module 1020 formed on a package substrate 1010 inside the stiffener ring 1031 and a liquid alloy TIM 1040 formed on the interposer module 1020. The package assembly 1000 may also include a package lid 1030 that may be bonded to the stiffener ring 1031 by a second adhesive 1062. The second adhesive 1062 may also include, for example, a silicone adhesive or an epoxy adhesive. The second adhesive 1062 may be composed of the same material as the first adhesive 1060. The package lid 1030 may have a square shape or rectangle shape in the horizontal cross-sectional view. Other suitable shapes of the package lid 1030 may be within the contemplated scope of disclosure.

The package assembly 1000 may also include a seal ring 1050 formed in a cavity 1030*d* of the package lid 1030. As illustrated in FIG. 10B, the seal ring 1050 may form a seal of the liquid alloy TIM 1040 around an entire perimeter of the liquid alloy TIM 1040. That is, the seal ring 1050 may surround the liquid alloy TIM 1040 and may together with the interposer module 1020 and package lid 1030 seal the liquid alloy TIM 1040. The liquid alloy TIM 1040 may have a square shape. In particular, the liquid alloy TIM 1040 may have a shape in the horizontal cross-sectional view that corresponds to (e.g., is substantially the same as) the shape of the cavity 1030*d* in the package lid 1030.

Figures 11A, 11B:
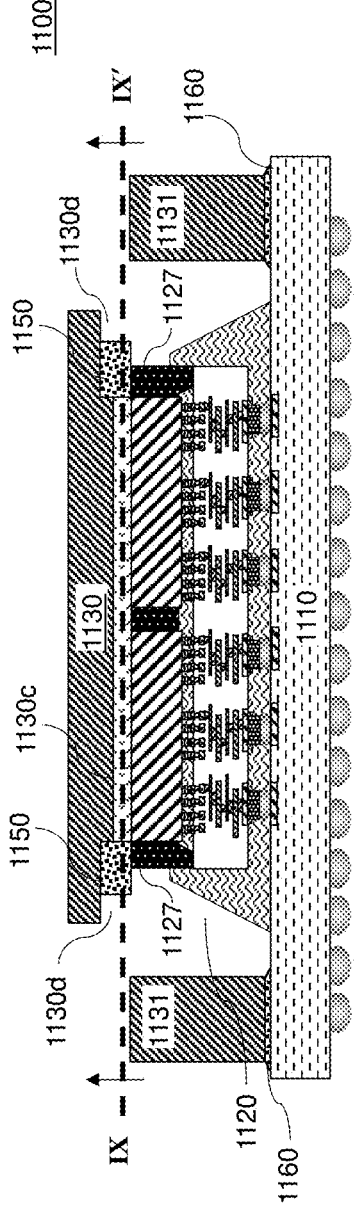
FIG. 11A illustrates a vertical cross-sectional view of the package assembly along the line X-X' in FIG. 11B according to one or more embodiments.
FIG. 11B illustrates a horizontal cross-sectional view of the package assembly along the line IX-IX' in FIG. 11A according to one or more embodiments.

FIGS. 11A and 11B illustrate a package assembly 1100 (e.g., organic/silicon interposer package) according to one or more embodiments. FIG. 11A illustrates a vertical cross-sectional view of the package assembly 1100 along the line X-X' in FIG. 11B according to one or more embodiments. FIG. 11B illustrates a horizontal cross-sectional view of the package assembly 1100 along the line IX-IX' in FIG. 11A according to one or more embodiments.

The package assembly 1100 may have a structure and function that is substantially similar to the structure and function described above with respect to package assembly 100. The package assembly 1100 may also be manufactured by a method that is substantially similar to the method described above with respect to package assembly 100. Therefore, the package assembly 1100 may be described below only to the extent that the structure of the package assembly 1100 may differ from the structure of the package assembly 100.

As illustrated in FIGS. 11A and 11B, the package assembly 1100 may include a stiffener ring 1131 that may be fixed to a package substrate 1110 by an adhesive 1160. The stiffener ring 1131 may be formed of a metal such as copper with a nickel coating, or an aluminum alloy. The adhesive 1160 may include, for example, a silicone adhesive or an epoxy adhesive. The package assembly 1100 may also include an interposer module 1120 formed on a package substrate 1110 inside the stiffener ring 1131 and a liquid alloy TIM 1140 formed on the interposer module 1120. The package assembly 1100 may also include a package lid 1130 on the liquid alloy TIM 1140. The package lid 1130 may have a square shape or rectangle shape in the horizontal cross-sectional view. Other suitable shapes of the package lid 1130 may be within the contemplated scope of disclosure.

The package assembly 1100 may include an adhesive seal ring 1150 formed in a cavity 1130*d* of the package lid 1130. The adhesive seal ring 1150 may include an adhesive such as a silicone adhesive or an epoxy adhesive, so that the adhesive seal ring 1150 may bond the lid 1130 to the interposer module 1120. In particular, the adhesive seal ring 1150 may bond the lid 1130 to the molding material layer 1127 of the interposer module 1120. The adhesive seal ring 1150 may be composed of the same material as the adhesive 1160.

The adhesive seal ring 1150 may be sufficiently viscous or sufficiently solid such that when it is formed in the cavity 1130*d* of the package lid 1130, the adhesive seal ring 1150 may maintain its shape. The adhesive seal ring 1150 may therefore, be able to contain the liquid alloy TIM 1140 as the liquid alloy TIM 1140 is dispensed onto the underside of the package lid 1130. The adhesive seal ring 1150 may have a pre-formed shape that may allow the adhesive seal ring 1150 to be placed in the cavity 1130*d* similar to the manner in which the seal ring 150 is placed in the cavity 130*d* in FIG. 4D above. Alternatively, the adhesive seal ring 1150 may be formed by dispensing a continuous bead of adhesive material around the perimeter of the protrusion portion 1130*c* of the package lid 1130.

As illustrated in FIG. 11B, the adhesive seal ring 1150 may form a seal of the liquid alloy TIM 1140 around an entire perimeter of the liquid alloy TIM 1140. That is, the seal ring 1150 may surround the liquid alloy TIM 1140 and may together with the interposer module 1120 and package lid 1130 seal the liquid alloy TIM 1140. The liquid alloy TIM 1140 may have a square shape. In particular, the liquid alloy TIM 1140 may have a shape in the horizontal cross-sectional view that corresponds to (e.g., is substantially the same as) the shape of the cavity 1130*d* in the package lid 1130.

Referring to FIGS. 1A-11B, a package assembly 100, 600, 700, 800, 900, 1000, 1100 may include an interposer module 120, 820', 820", 920', 920", 1020, 1120 on a package substrate 110, 810, 910, 1010, 1110, a liquid alloy thermal interface material (TIM) 140, 840', 840", 940', 940", 940''', 940'''', 1040, 1140 on the interposer module 120, 820', 820", 920', 920", 1020, 1120, a seal ring 150, 650, 750, 850', 850", 950', 950", 950''', 950'''', 1050, 1150 surrounding the liquid alloy TIM 140, 840', 840", 940', 940", 940''', 940'''', 1040, 1140, and a package lid 130, 830, 930, 1030, 1130 on the liquid alloy TIM 140, 840', 840", 940', 940", 940''', 940'''', 1040, 1140 and seal ring 150, 650, 750, 850', 850", 950', 950", 950''', 950'''', 1050, 1150, the seal ring 150, 650, 750, 850', 850", 950', 950", 950''', 950'''', 1050, 1150, interposer module 120, 820', 820", 920', 920", 1020, 1120 and package lid 130, 830, 930, 1030, 1130 sealing the liquid alloy TIM 140, 840', 840", 940', 940", 940''', 940'''', 1040, 1140.

In one embodiment, the package lid 130, 830, 930, 1030, 1130 may include a main body 130*a* and a protrusion portion 130*c* that projects from the main body 130*a* and contacts the liquid alloy TIM 140, 840', 840", 940', 940", 940''', 940'''', 1040, 1140. In one embodiment, a bottom surface of the main body 130*a* of the package lid 130, 830, 930, 1030, 1130 may include a cavity 130*d*, 830*d*, 830*d"*, 930*d*, 930*d"*, 930*d'''*, 930*d''''*, 1030*d*, 1130*d* and the protrusion portion 130*c* may project from a bottom surface of the cavity 130*d*, 830*d*, 830*d"*, 930*d*, 930*d"*, 930*d'''*, 930*d''''*, 1030*d*, 1130*d*. In one embodiment, the seal ring 150, 650, 750, 850', 850", 950', 950", 950''', 950'''', 1050, 1150 may be located around the protrusion portion 130*c* and around the liquid alloy TIM 140, 840', 840", 940', 940", 940''', 940'''', 1040, 1140. In one embodiment, the seal ring 150, 650, 750, 850', 850", 950', 950", 950''', 950'''', 1050, 1150 may include an inner surface 150*a* that contacts an outer surface 130*c*1 of the protrusion portion 130*c* and contacts an outermost portion 140*a* of the liquid alloy TIM 140, 840', 840", 940', 940", 940''', 940'''', 1040, 1140. In one embodiment, the seal ring 150, 650, 750, 850', 850", 950', 950", 950''', 950'''', 1050, 1150 may include a bottom surface 150*b* that may adjoin the inner surface 150*a* of the seal ring 150, 650, 750, 850', 850", 950', 950", 950''', 950'''', 1050, 1150 and may contact an upper surface of the interposer module 120, 820', 820", 920', 920", 1020, 1120 so that a seal of the liquid alloy TIM 140, 840', 840", 940', 940", 940''', 940'''', 1040, 1140 may be formed between the bottom surface 150*b* of the seal ring 150, 650, 750, 850', 850", 950', 950", 950''', 950'''', 1050, 1150 and the upper surface of the interposer module 120, 820', 820", 920', 920", 1020, 1120. In one embodiment, the interposer module 120, 820', 820", 920', 920", 1020, 1120 may include a molding material layer 127 and the bottom surface of the seal ring may contact an upper surface 127*a* of the molding material layer 127. In one embodiment, the seal ring 150, 650, 750, 850', 850", 950', 950", 950''', 950'''', 1050, 1150 may be compressed between the main body 130*a* of the package lid 130, 830, 930, 1030, 1130 and the upper surface of the interposer module 120, 820', 820", 920', 920", 1020, 1120 so as to form the seal of the liquid alloy TIM 140, 840', 840", 940', 940", 940''', 940'''', 1040, 1140. In one embodiment, the liquid alloy TIM 140, 840', 840", 940', 940", 940''', 940'''', 1040, 1140 may include one of InGa, InGaSn, GaInSn, and GaInSnZn. The seal ring 150, 650, 750, 850', 850", 950', 950", 950''', 950'''', 1050, 1150 may include one of rubber, a graphite film and an adhesive.

Referring to FIGS. 1A-11B, a method of making a package assembly 100, 600, 700, 800, 900, 1000, 1100 may include mounting an interposer module 120, 820', 820", 920', 920", 1020, 1120 on a package substrate 110, 810, 910, 1010, 1110, placing a seal ring 150, 650, 750, 850', 850", 950', 950", 950''', 950'''', 1050, 1150 on a package lid 130, 830, 930, 1030, 1130, placing a liquid alloy thermal interface material (TIM) 140, 840', 840", 940', 940", 940''', 940'''', 1040, 1140 on the package lid 130, 830, 930, 1030, 1130 so as to be contained by the seal ring 150, 650, 750, 850', 850", 950', 950", 950''', 950'''', 1050, 1150, and attaching the package substrate 110, 810, 910, 1010, 1110 to the package lid 130, 830, 930, 1030, 1130 such that the liquid alloy TIM 140, 840', 840", 940', 940", 940''', 940'''', 1040, 1140 may be contained and sealed by the seal ring 150, 650, 750, 850', 850", 950', 950", 950''', 950'''', 1050, 1150, interposer module 120, 820', 820", 920', 920", 1020, 1120 and package lid 130, 830, 930, 1030, 1130.

In one embodiment, the method may further include forming a cavity 130*d*, 830*d*, 830*d"*, 930*d*, 930*d"*, 930*d'''*, 930*d''''*, 1030*d*, 1130*d* in a main body 130*a* of the package lid 130, 830, 930, 1030, 1130 such that a protrusion portion 130*c* projects from a main body 130*a* of the package lid 130, 830, 930, 1030, 1130. In one embodiment, the forming of the protrusion portion 130*c* may include milling a cavity 130*d*, 830*d*, 830*d"*, 930*d*, 930*d"*, 930*d'''*, 930*d''''*, 1030*d*, 1130*d* in the main body 130*a* of the package lid 130, 830, 930, 1030, 1130, so that the protrusion portion 130*c* projects from a bottom surface of the cavity 130*d*, 830*d*, 830*d"*, 930*d*, 930*d"*, 930*d'''*, 930*d''''*, 1030*d*, 1130*d*. In one embodiment, the placing of the seal ring 150, 650, 750, 850', 850", 950', 950", 950''', 950'''', 1050, 1150 on the package lid 130, 830, 930, 1030, 1130 may include placing the seal ring 150, 650, 750, 850', 850", 950', 950", 950''', 950'''', 1050, 1150 around the protrusion portion 130*c*. In one embodiment, the placing of the seal ring 150, 650, 750, 850', 850", 950', 950", 950''', 950'''', 1050, 1150 around the protrusion portion 130*c* may include contacting an inner surface 150*a* of the seal ring 150, 650, 750, 850', 850", 950', 950", 950''', 950'''', 1050, 1150 to an outer surface 130*c*1 of the protrusion portion 130*c*. In one embodiment, the placing of the liquid alloy TIM 140, 840', 840", 940', 940", 940''', 940'''', 1040, 1140 on the package lid 130, 830, 930, 1030, 1130 may include dispensing the liquid alloy TIM 140, 840', 840", 940', 940", 940''', 940'''', 1040, 1140 onto the package lid 130, 830, 930, 1030, 1130 so that the liquid alloy TIM 140, 840', 840", 940', 940", 940''', 940'''', 1040, 1140 may be contained by the inner surface 150*a* of the seal ring 150, 650, 750, 850', 850", 950', 950", 950''', 950'''', 1050, 1150. In one embodiment, the attaching of the package substrate 110, 810, 910, 1010, 1110 to the package lid 130, 830, 930, 1030, 1130 may include contacting a bottom surface 150*b* of the seal ring 150, 650, 750, 850', 850", 950', 950", 950''', 950'''', 1050, 1150 to an upper surface of the interposer module 120, 820', 820", 920', 920", 1020, 1120 so as to form a seal of the liquid alloy TIM 140, 840', 840", 940', 940", 940''', 940'''', 1040, 1140 between the bottom surface 150*b* of the seal ring 150, 650, 750, 850', 850", 950', 950", 950''', 950'''', 1050, 1150 and the upper surface of the interposer module 120, 820', 820", 920', 920", 1020, 1120. In one embodiment, the interposer module 120, 820', 820", 920', 920", 1020, 1120 may include a molding material layer 127 and the contacting of the bottom surface of the seal ring 150, 650, 750, 850', 850", 950', 950", 950''', 950'''', 1050, 1150 to the upper surface of the interposer module 120, 820', 820", 920', 920", 1020, 1120 may include contacting the bottom surface 150*b* of the seal ring 150, 650, 750, 850', 850", 950', 950", 950''', 950'''', 1050, 1150 to an upper surface 127a of the molding material layer 127, and the attaching of the package substrate 110, 810, 910, 1010, 1110 to the package lid 130, 830, 930, 1030, 1130 further may include compressing the seal ring 150, 650, 750, 850', 850'', 950', 950'', 950''', 950'''', 1050, 1150 between the main body 130a of the package lid 130, 830, 930, 1030, 1130 and the upper surface of the interposer module 120, 820', 820'', 920', 920'', 1020, 1120 so as to form the seal of the liquid alloy TIM 140, 840', 840'', 940', 940'', 940''', 940'''', 1040, 1140. In one embodiment, the attaching of the package substrate 110, 810, 910, 1010, 1110 to the package lid 130, 830, 930, 1030, 1130 may include contacting the protrusion portion 130c to the liquid alloy TIM 140, 840', 840'', 940', 940'', 940''', 940'''', 1040, 1140.

Referring to FIGS. 1A-11B, a package assembly 100, 600, 700, 800, 900, 1000, 1100 may include an interposer module 120, 820', 820'', 920', 920'', 1020, 1120 on a package substrate 110, 810, 910, 1010, 1110, the interposer module 120, 820', 820'', 920', 920'', 1020, 1120 including a molding material layer 127, a liquid alloy thermal interface material (TIM) 140, 840', 840'', 940', 940'', 940''', 940'''', 1040, 1140 on the interposer module 120, 820', 820'', 920', 920'', 1020, 1120, a seal ring 150, 650, 750, 850', 850'', 950', 950'', 950''', 950'''', 1050, 1150 on the liquid alloy TIM 140, 840', 840'', 940', 940'', 940''', 940'''', 1040, 1140 and including an inner surface 150a that may contact an outermost portion 140a of the liquid alloy TIM 140, 840', 840'', 940', 940'', 940''', 940'''', 1040, 1140, and a bottom surface 150b that may adjoin the inner surface 150a and may contact an upper surface 127a of the molding material layer 127, a package lid 130, 830, 930, 1030, 1130 that may be over the interposer module 120, 820', 820'', 920', 920'', 1020, 1120 and attached to the package substrate 110, 810, 910, 1010, 1110, the package lid 130, 830, 930, 1030, 1130 including a main body 130a including a cavity 130d, 830d', 830d'', 930d', 930d'', 930d''', 930d'''', 1030d, 1130d, and a protrusion portion 130c that projects from a bottom surface of the cavity 130d, 830d', 830d'', 930d', 930d'', 930d''', 930d'''', 1030d, 1130d, the seal ring 150, 650, 750, 850', 850'', 950', 950'', 950''', 950'''', 1050, 1150 being compressed between the main body 130a of the package lid 130, 830, 930, 1030, 1130 and the upper surface of the molding material layer and the liquid alloy TIM 140, 840', 840'', 940', 940'', 940''', 940'''', 1040, 1140 may be surrounded by the inner surface of the seal ring 150, 650, 750, 850', 850'', 950', 950'', 950''', 950'''', 1050, 1150.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure

What is claimed is:

1. A method of making a package assembly, the method comprising:

mounting an interposer module on a package substrate;

placing a seal ring around a protrusion portion of a package lid;

placing a liquid alloy thermal interface material (TIM) on the protrusion portion of the package lid such that the liquid alloy TIM contacts the seal ring and is contained by the seal ring; and attaching the package substrate to the package lid such that the liquid alloy TIM is contained and sealed by the seal ring, interposer module and the protrusion portion of the package lid.

2. The method of claim 1, further comprising:

forming a cavity in a main body of the package lid such that the protrusion portion projects from the cavity in the main body of the package lid.

3. The method of claim 2, wherein the forming of the cavity comprises milling the cavity in the main body of the package lid, so that the protrusion portion projects from a bottom surface of the cavity.

4. The method of claim 1, wherein the placing the seal ring around the protrusion portion comprises placing an upper portion of the seal ring around the protrusion portion.

5. The method of claim 1, wherein the placing of the seal ring around the protrusion portion comprises contacting an inner surface of the seal ring to an outer surface of the protrusion portion.

6. The method of claim 5, wherein the placing of the liquid alloy TIM on the package lid comprises dispensing the liquid alloy TIM onto the package lid so that the liquid alloy TIM is contained by the inner surface of the seal ring.

7. The method of claim 5, wherein the attaching of the package substrate to the package lid comprises contacting a bottom surface of the seal ring to an upper surface of the interposer module so as to form a seal of the liquid alloy TIM between the bottom surface of the seal ring and the upper surface of the interposer module.

8. The method of claim 7, wherein the interposer module comprises a molding material layer and the contacting of the bottom surface of the seal ring to the upper surface of the interposer module comprises contacting the bottom surface of the seal ring to an upper surface of the molding material layer, and wherein the attaching of the package substrate to the package lid further comprises compressing the seal ring between the main body of the package lid and the upper surface of the interposer module so as to form the seal of the liquid alloy TIM.

9. The method of claim 1, wherein the attaching of the package substrate to the package lid comprises contacting the interposer module to the liquid alloy TIM.

10. A method of making a package structure, the method comprising:

mounting an interposer module including a molding material layer on a package substrate;

placing a seal ring on a package lid;

placing a thermal interface material (TIM) on the package lid such that the seal ring is around the TIM; and attaching the package substrate to the package lid such that the interposer module contacts the TIM and the seal ring is compressed between the package lid and the molding material layer.

11. The method of claim 10, wherein the package lid comprises a cavity and the placing of the seal ring on the package lid comprises placing the seal ring in the cavity.

12. The method of claim 11, wherein the package lid comprises a main body including the cavity, and a sidewall portion extending from the main body, and the attaching of the package substrate to the package lid comprises attaching the package substrate to the sidewall portion of the package lid.

13. The method of claim 11, wherein the package lid comprises a protrusion portion projecting from a bottom surface of the cavity, and the placing of the TIM on the package lid comprises placing the TIM on the protrusion portion.

14. The method of claim 13, wherein the placing of the seal ring in the cavity comprises placing the seal ring around the protrusion portion.

15. The method of claim 14, wherein the placing of the seal ring around the protrusion portion comprises contacting an inner surface of the seal ring to an outer surface of the protrusion portion.

16. The method of claim 10, wherein the attaching of the package substrate to the package lid comprises compressing the seal ring between a bottom surface of the cavity and an upper surface of the interposer module.

17. The method of claim 16, wherein the compressing of the seal ring between the bottom surface of the cavity and the upper surface of the interposer module comprises compressing the seal ring between the bottom surface of the cavity and an upper surface of the molding material layer.

18. The method of claim 17, wherein a width of the molding material layer is less than a width of the seal ring, and the compressing the seal ring between the bottom surface of the cavity and an upper surface of the molding material layer comprises compressing less than an entire width of the seal ring between the bottom surface of the cavity and the upper surface of the molding material layer.

19. The method of claim 10, wherein the attaching of the package substrate to the package lid comprises contacting a bottom surface of the seal ring to an upper surface of the interposer module so as to form a seal of the TIM between the bottom surface of the seal ring and the upper surface of the interposer module.

20. A package structure, comprising:
  a plurality of interposer modules comprising a molding material layer on a package substrate;
  a plurality of thermal interface materials (TIMs) on the plurality of interposer modules, respectively;
  an adhesive layer on the package substrate around the plurality of interposer modules;
  a package lid attached by the adhesive layer to the package substrate and including a plurality of protrusion portions on the plurality of TIMs, respectively; and
  a plurality of seal rings around the plurality of protrusion portions, respectively and around the plurality of TIMs, respectively, wherein the plurality of seal rings are compressed between the package lid and the molding material layer of the plurality of interposer modules.

* * * * *